(12) United States Patent
Nagase et al.

(10) Patent No.: US 10,027,313 B2
(45) Date of Patent: Jul. 17, 2018

(54) RECEIVER, COMMUNICATION DEVICE, AND COMMUNICATION METHOD

(71) Applicant: Renesas Electronics Corporation, Tokyo (JP)

(72) Inventors: Hirokazu Nagase, Tokyo (JP); Koichi Takeda, Tokyo (JP); Shunichi Kaeriyama, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/820,628

(22) Filed: Aug. 7, 2015

(65) Prior Publication Data

US 2016/0056850 A1 Feb. 25, 2016

(30) Foreign Application Priority Data

Aug. 25, 2014 (JP) .................................. 2014-170758

(51) Int. Cl.
  *H04L 27/06* (2006.01)
  *H03K 5/04* (2006.01)
(52) U.S. Cl.
  CPC ...................... *H03K 5/04* (2013.01)
(58) Field of Classification Search
  CPC ..... H04B 5/0075; H04L 25/0266; H03M 5/02
  USPC .................. 375/258, 340; 714/799; 361/159; 363/21.02, 21.11, 21.17
  See application file for complete search history.

(56) References Cited

U.S. PATENT DOCUMENTS

| 4,890,210 A * | 12/1989 | Myers ............... H02M 3/33507 363/21.11 |
| 8,948,276 B2 | 2/2015 | Kaeriyama |
| 2006/0109918 A1* | 5/2006 | Brown ..................... H04B 3/02 375/258 |

(Continued)

FOREIGN PATENT DOCUMENTS

| JP | 10-341192 A | 12/1998 |
| JP | 2001-111390 A | 4/2001 |

(Continued)

OTHER PUBLICATIONS

Communication dated Apr. 24, 2018 issued by the Japanese Patent Office in counterpart application No. 2014-170758.

*Primary Examiner* — Chieh M Fan
*Assistant Examiner* — Fitwi Hailegiorgis
(74) *Attorney, Agent, or Firm* — Sughrue Mion, PLLC

(57) ABSTRACT

To provide a receiver, a communication device, and a communication method capable of restoring a signal transmitted via a non-contact transmission channel with high accuracy. A communication device has a transmission circuit that converts an input signal into a pulse, a non-contact transmission channel that has a primary side coil and a secondary side coil and transmits the pulse from the transmission circuit in a non-contact manner, a restoration circuit that restores the input signal on the basis of a reception signal corresponding to the pulse transmitted via the non-contact transmission channel, an initialization unit that initializes an output of the non-contact transmission channel, and an initialization control unit that outputs a control signal of controlling the initialization unit on the basis of the reception signal corresponding to the pulse received via the non-contact transmission channel.

20 Claims, 24 Drawing Sheets

(56) References Cited

U.S. PATENT DOCUMENTS

| | | | |
|---|---|---|---|
| 2009/0201620 A1* | 8/2009 | Gray | B60L 11/00 361/159 |
| 2013/0055052 A1* | 2/2013 | Kaeriyama | H01L 25/162 714/799 |
| 2013/0328505 A1* | 12/2013 | Sadwick | H05B 39/041 315/307 |
| 2014/0098579 A1* | 4/2014 | Kleinpenning | H02M 3/33523 363/21.17 |
| 2014/0204622 A1* | 7/2014 | Telefus | H02M 3/33576 363/21.02 |

FOREIGN PATENT DOCUMENTS

| | | |
|---|---|---|
| JP | 2004-187117 A | 7/2004 |
| JP | 2013-229815 A | 11/2013 |
| WO | 2007/004428 A1 | 1/2007 |

* cited by examiner

RECEIVER, COMMUNICATION DEVICE, AND COMMUNICATION METHOD

CROSS-REFERENCE TO RELATED APPLICATIONS

This application is based upon and claims the benefit of priority from Japanese patent application No. 2014-170758, filed on Aug. 25, 2014, the disclosure of which is incorporated herein in its entirety by reference.

BACKGROUND

The present invention relates to a receiver, a communication device, and a communication method.

Japanese Unexamined Patent Application Publication No. 2001-111390 discloses a pulse isolator. The pulse isolator disclosed in Japanese Unexamined Patent Application Publication No. 2001-111390 uses a pulse transformer. Using this makes it possible to transmit a pulse signal while insulation is achieved between input and output terminals. Specifically, when an input pulse signal is supplied, at a rising edge and a falling edge of the input pulse signal, a current flows in a primary winding of the pulse transformer. Therefore, a voltage is induced at both ends of a secondary winding of the pulse transformer.

Further, on a secondary side of the pulse transformer, a resistor for suppressing ringing is provided. That is, the both ends of the secondary winding are connected through the resistor.

SUMMARY

In the pulse isolator disclosed in Japanese Unexamined Patent Application Publication No. 2001-111390, the both ends of the secondary winding are connected through the resistor. This causes attenuation of an output pulse signal and hinders normal communication.

The other problems and novel features are revealed by the description of this specification and the attached drawings.

According to an aspect of the present invention, a communication device includes a restoration circuit that restores an input signal on the basis of a reception signal corresponding to a pulse transmitted via a non-contact transmission channel, an initialization unit that initializes an output of the non-contact transmission channel, and an initialization control unit that outputs a control signal that controls the initialization unit on the basis of the reception signal corresponding to the pulse received via the non-contact transmission channel.

According to the aspect, it is possible to restore a signal transmitted via the non-contact transmission channel with high accuracy.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

To make explanation clear, the following description and the figures are appropriately omitted and simplified. Further, components indicated in the figures as functional blocks that perform various processes can be structured by a CPU, a memory, and other circuits as hardware and are achieved by a program or the like loaded to the memory as software. Therefore, persons skilled in the art understand that those functional blocks can be achieved only by hardware or software or by combination of those in various forms, and are not limited to one of those. It should be noted that in the figures, the same components are denoted by the same symbols, an overlapped explanation is omitted as necessary.

Figure 1:
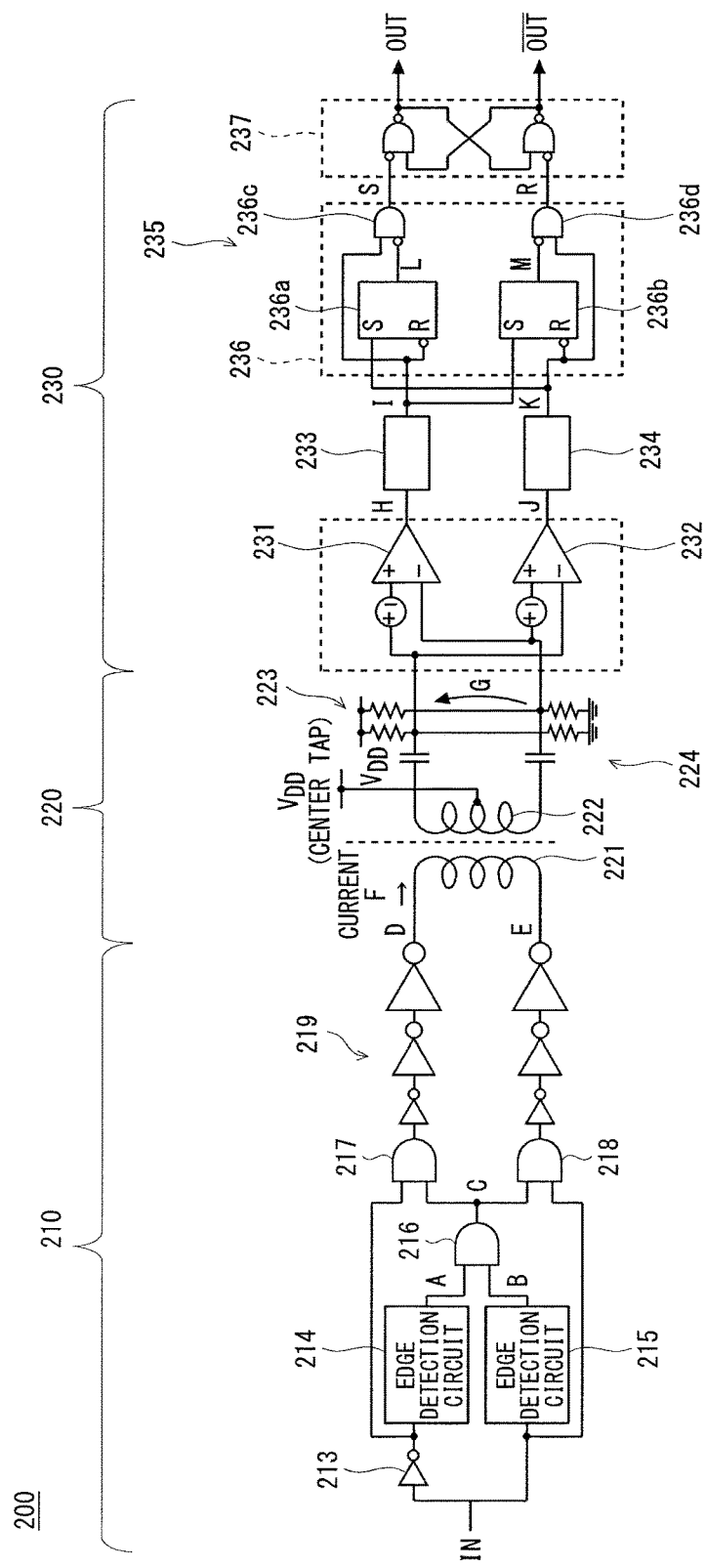
FIG. 1 is a circuit diagram showing the structure of a communication device including a non-contact transmission channel.
Figure 2:
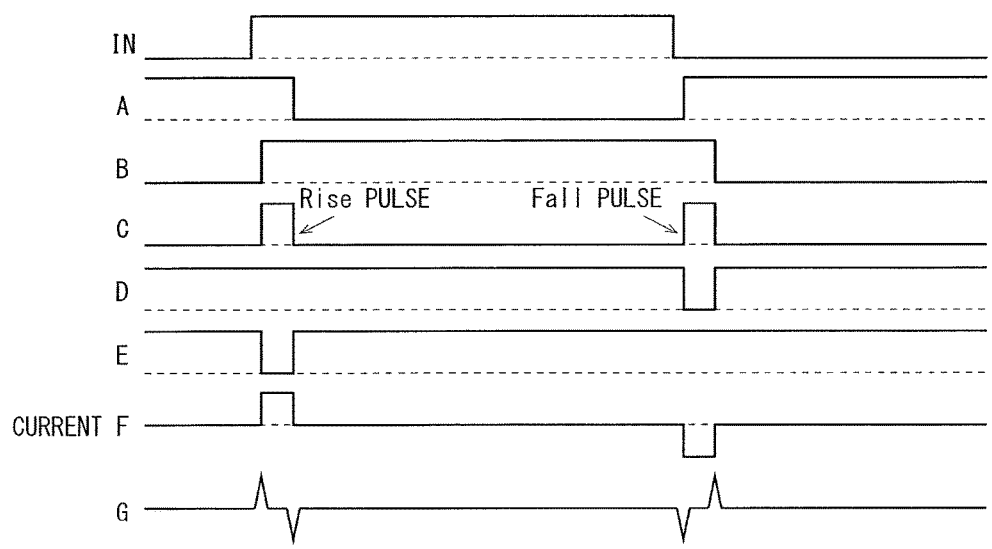
FIG. 2 is a timing chart showing signal waveforms in the communication device shown in FIG. 1.
Figure 3:
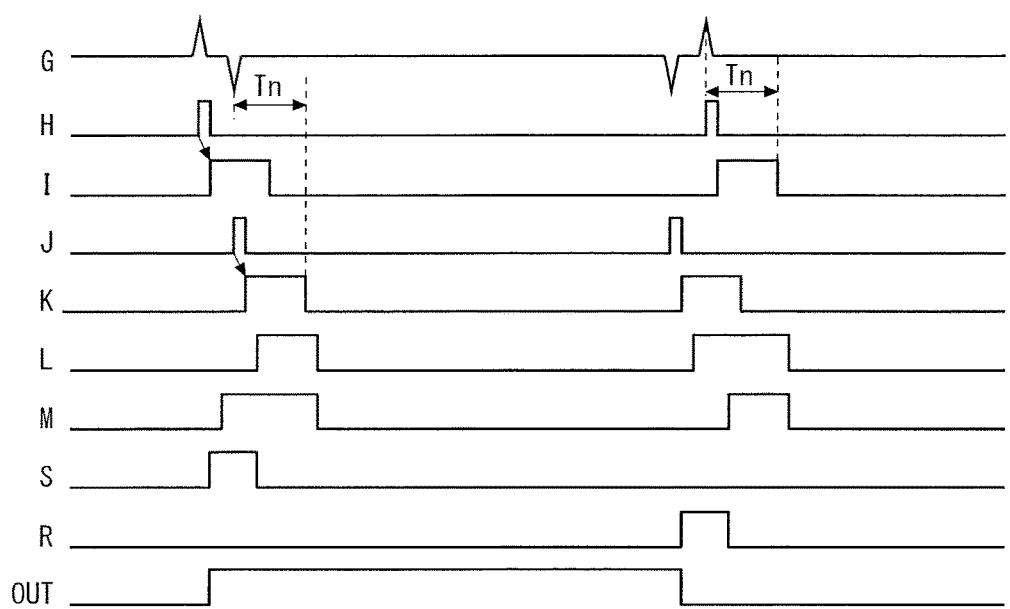
FIG. 3 is a timing chart showing signal waveforms in the communication device shown in FIG. 1.

First, the structure and operation of a communication device including a non-contact transmission channel will be described with reference to FIGS. 1 to 3. FIG. 1 is a circuit diagram showing the structure of a communication device 200, and FIG. 2 and FIG. 3 are timing charts showing signal waveforms of the communication device 200. FIG. 2 and FIG. 3 show the signal waveforms at terminals A to S shown in FIG. 1. That is, signals at the terminals A to S will be described as signals A to S as appropriate.

As shown in FIG. 1, the communication device 200 includes a transmission circuit 210, a non-contact transmission channel 220, and a reception circuit 230. The communication device 200 is a pulse isolator or the like and transmits a signal via the non-contact transmission channel 220. That is, the signal transmitted from the transmission circuit 210 is received by the reception circuit 230 via the non-contact transmission channel 220.

The transmission circuit 210 includes an inverting amplifier 213, an edge detection circuit 214, an edge detection circuit 215, AND circuits 216 to 218, and an inverting amplifier 219. The non-contact transmission channel 220 includes a primary side coil 221, a secondary side coil 222, a filter 223, and a filter 224. The reception circuit 230 includes a restoration circuit 235. The restoration circuit 235 includes a comparator 231, a comparator 232, a widening circuit 233, a widening circuit 234, a determination circuit 236, and a latch circuit 237.

The transmission circuit 210 is a circuit that converts an input signal IN into a transmission pulse. The transmission pulse generated in the transmission circuit 210 is received by the reception circuit 230 via the non-contact transmission channel 220. The restoration circuit 235 of the reception circuit 230 restores the signal by using a reception pulse received via the non-contact transmission channel 220.

The input signal IN is split into two signals. One of the input signal IN is input to the edge detection circuit 214 via the inverting amplifier 213, and the other of the input signal IN is input to the edge detection circuit 215. The edge detection circuit 214 and the edge detection circuit 215 detect a rising edge of the signal. Therefore, when the input signal IN shown in FIG. 2 is input to the transmission circuit 210, output signals from the edge detection circuit 214 and the edge detection circuit 215 show signal waveforms indicated as A and B of FIG. 2, respectively. The signals A and B from the edge detection circuit 214 and the edge detection circuit 215 are input to the AND circuit 216. The AND circuit 216 outputs AND of the signal A and the signal B to the AND circuits 217 and 218. The output from the AND circuit 216 is indicated as a signal C shown in FIG. 2. The signal C from the AND circuit 216 includes a rising pulse corresponding to the rising edge of the input signal IN and a falling pulse corresponding to the falling edge thereof.

To the AND circuit 217, the signal C from the AND circuit 216 and a signal from the inverting amplifier 213 are input. Therefore, the AND circuit 217 outputs AND of the signal C and an inversion signal of the input signal IN. The output of the AND circuit 217 is amplified by the inverting amplifier 219 having three stages, thereby generating a signal D shown in FIG. 2. To the AND circuit 218, the signal C of the AND circuit 216 and the input signal IN are input. Therefore, the AND circuit 217 outputs AND of the signal C and the input signal IN. The output of the AND circuit 218 is amplified by the inverting amplifier 219 having the three stages, thereby generating a signal E shown in FIG. 2.

The transmission circuit 210 transmits the signal D and the signal E to the non-contact transmission channel 220. The non-contact transmission channel 220 includes the primary side coil 221, the secondary side coil 222, the filter 223, and the filter 224. The primary side coil 221 and the secondary side coil 222 form an insulation transformer with an insulation boundary intervened therebetween. Further, the secondary side coil 222 is connected to VDD by a center tap. To one end of the primary side coil 221, the signal D is supplied, and to the other end thereof, the signal E is supplied.

Therefore, a current F corresponding to the signal D and the signal E flows through the primary side coil 221 (see F shown in FIG. 2). At a timing corresponding to the rising edge of the input signal IN or the falling edge thereof, the pulse-like current F flows through the primary side coil 221. Further, at the rising edge of the input signal IN, a direction of the current F that flows through the primary side coil 221 is opposite to that at the falling edge thereof. As a result, it is possible to convert edge information of the input signal IN to a polarity of the transmission pulse.

In the secondary side coil 222, a differential voltage corresponding to the current F is induced. The differential voltage G is shown as a signal G of FIG. 2 and FIG. 3. In the differential voltage G, an edge pulse (main pulse) and a counter pulse exist. The edge pulse corresponds to the edge of the input signal IN. The counter pulse appears immediately after the edge pulse. The counter pulse has the polarity opposite to the edge pulse and appears as a pair with the edge pulse. In the differential voltage G, the edge pulse having a positive polarity corresponding to the rising edge of the input signal IN and the edge pulse having a negative polarity corresponding to the falling edge of the input signal IN. Further, immediately after the edge pulse having the positive polarity, the counter pulse having the negative polarity exists, and immediately after the edge pulse of the negative polarity, the counter pulse of the positive polarity exists.

One end of the secondary side coil 222 is connected to the filter 223, and the other end thereof is connected to the filter 224. The filter 223 and the filter 224 are high-pass filters (HPF) including R and C, for example. The filter 223 and the filter 224 remove a noise component from a reception pulse received via the non-contact transmission channel 220. The signals that pass through the filters 223 and 224 are output to the comparator 231 and 232, respectively.

In the comparator 231, an output signal of the filter 223 is input to a non-inverting input terminal, and an output signal of the filter 224 is input to the inverting input terminal. Therefore, the comparator 231 detects a pulse having a positive polarity of the differential voltage G. The output of the comparator 231 shows a waveform of a signal H shown in FIG. 3. In the comparator 232, the output of the filter 223 is input to the inverting input terminal, and the output of the filter 224 is input to the non-inverting input terminal. Therefore, the comparator 231 detects a pulse having a negative polarity of the differential voltage G. The output of the comparator 232 shows a waveform of a signal J shown in FIG. 3. The signal H includes a pulse corresponding to the pulse having the positive polarity of the differential voltage G. The signal J includes a pulse corresponding to the pulse having the negative polarity of the differential voltage G. The comparators 231 and 232 function as difference amplifiers with both terminals of the secondary side coil 222 as differential inputs.

The signal H from the comparator 231 is input to the widening circuit 233. The signal J from the comparator 232 is input to the widening circuit 234. The widening circuits 233 and the widening circuit 234 increase pulse widths of the input signals H and J, respectively. That is, the widening circuit 233 and the widening circuit 234 are delay circuits that output the rising edge at high speed and delay and output the falling edge. As a result, it is possible to delay the falling edge of the pulse. Thus, the widening circuit 233 increases the pulse width of the pulse included in the signal H. The widening circuit 234 increases the pulse width of the pulse included in the signal J. Therefore, the output from the widening circuit 233 and the output from the widening circuit 234 show waveforms of a signal I and a signal K shown in FIG. 3, respectively.

The signal I from the widening circuit 233 and the signal K from the widening circuit 234 are input to the determination circuit 236. The determination circuit 236 is a circuit that determines which pulse of the signal I and the signal K gets thereto first. The determination circuit 236 includes a flip-flop circuit 236a, a flip-flop circuit 236b, an AND circuit 236c, and an AND circuit 236d. The flip-flop circuit 236a and the flip-flop circuit 236b are each an RS flip-flop circuit that gives priority to S.

The signal I from the widening circuit 233 is input to an S terminal of the flip-flop circuit 236b and the AND circuit 236c. Further, the signal I from the widening circuit 233 is inverted and input to an R terminal of the flip-flop circuit 236a. The signal K from the widening circuit 234 is input to an S terminal of the flip-flop circuit 236a and the AND circuit 236d. Further, the signal K from the widening circuit 233 is inverted and input to an R terminal of the flip-flop circuit 236b.

The flip-flop circuit 236a is set at K=1 and reset at I=0. The flip-flop circuit 236b is set at I=1 and reset at K=0. Therefore, the signal from the flip-flop circuit 236a and the signal from the flip-flop circuit 236b show waveforms of a signal L and a signal M shown in FIG. 3, respectively.

The signal L from the flip-flop circuit 236a is inverted and input to the AND circuit 236c. The signal M from the flip-flop circuit 236b is inverted and input to the AND circuit 236d. Therefore, an output of the AND circuit 236c and an output of the AND circuit 236d are waveforms of a signal S and a signal R shown in FIG. 3, respectively. The signal S from the AND circuit 236c and the signal R from the AND circuit 236d are inverted and input to the latch circuit 237. The latch circuit 237 includes two NAND circuits.

An output signal OUT from the latch circuit 237 is such a pulse signal that the rise of a pulse of the signal S is set as the rising edge, and the rising edge of a pulse of the signal R is set as the falling edge. Thus, the output signal OUT from the latch circuit 237 is a signal equivalent to the input signal IN. In this way, the restoration circuit 235 restores the input signal IN. A part or all of the communication device 200 and the communication method described above can be used in the embodiments to be described later.

In this way, in the communication device 200 such as an isolator, the transmission circuit 210 extracts the edge part from the input signal IN and generates a rising pulse and a falling pulse. Then, with the rising pulse and the falling pulse, the direction of the current F that flows through the primary side coil 221 is changed. That is, edge information related to the rising edge and the falling edge of the input signal IN is converted to the polarity of a reception pulse. For example, at the rising edge of the input signal IN, the differential voltage G becomes an edge pulse having the positive polarity, and at the falling edge, the differential voltage G becomes an edge pulse having the negative polarity. In this way, the polarity of the differential voltage G is changed between the rising edge and the falling edge of the input signal IN.

In the communication device 200 as described above, when the counter pulse on the reception side is extended, the pulse interferes with a subsequent edge pulse. As a result, there is a fear that Hi/Lo information may be lost, and the restoration circuit 235 may perform erroneous restoration. This causes a problem in that a delay reduction and achievement of high data rate are interfered. On the other hand, components other than the main pulse included in the differential voltage G is an unnecessary component for the restoration of the signal.

Figure 4:
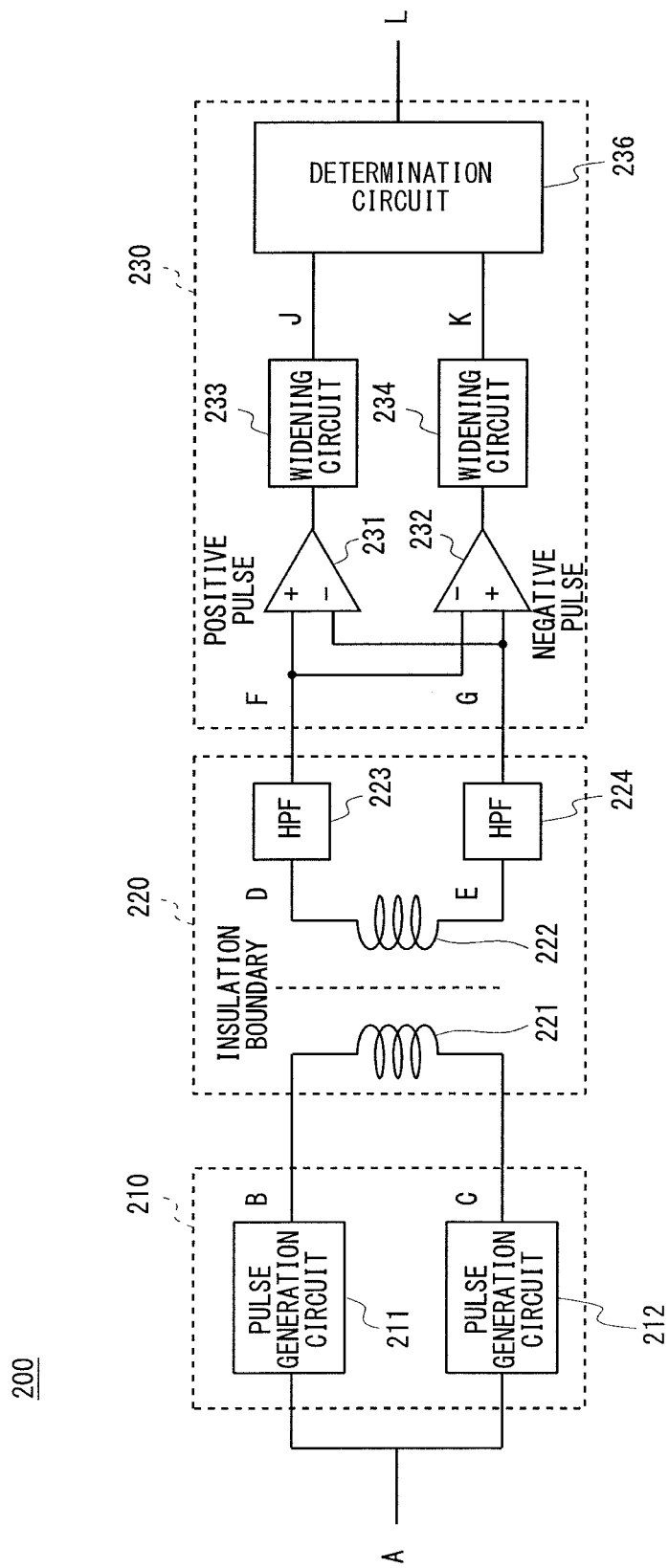
FIG. 4 is a diagram showing the schematic structure of the communication device.
Figure 5:
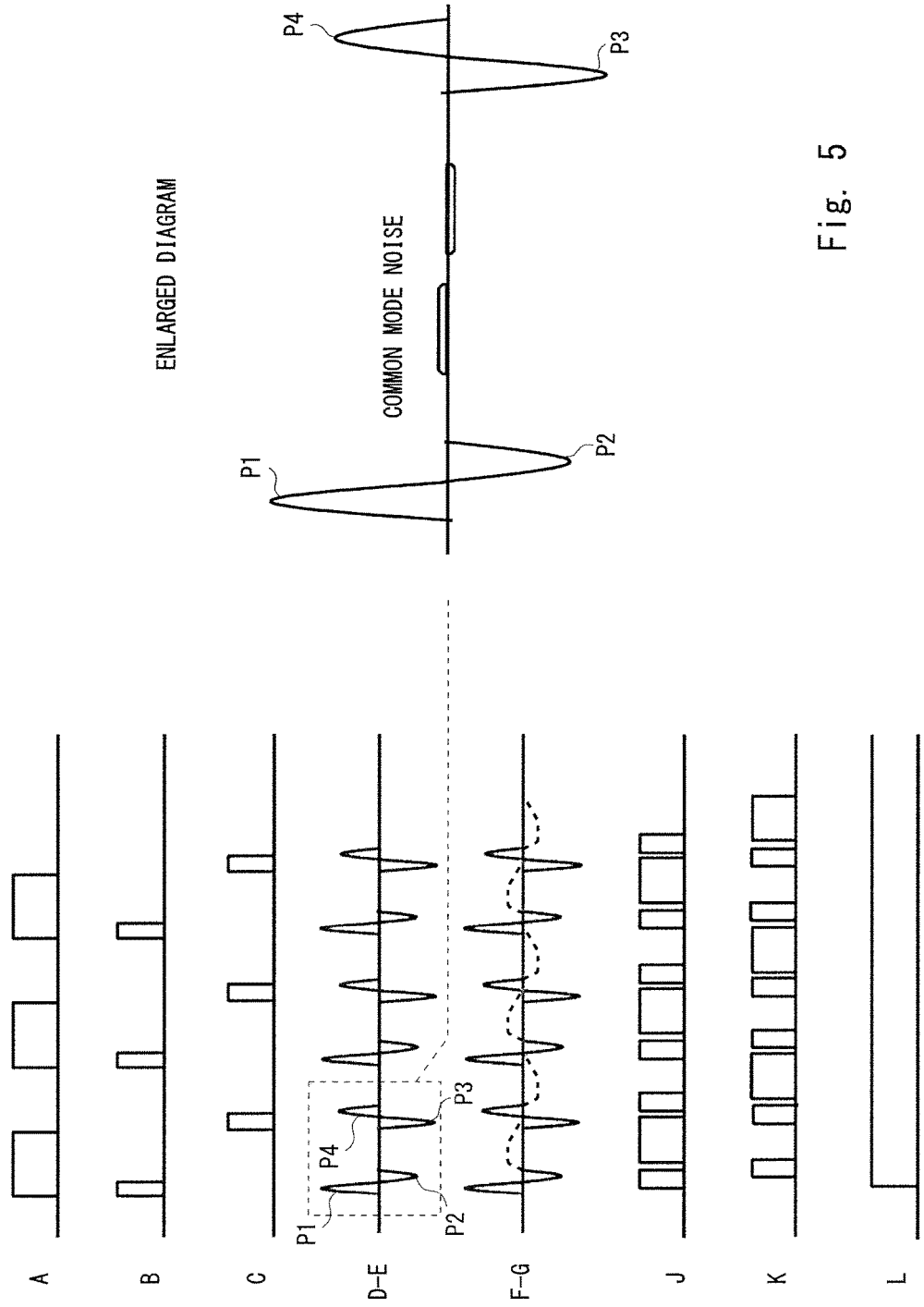
FIG. 5 is a timing chart showing signal waveforms of the communication device shown in FIG. 4.

Subsequently, with reference to FIG. 4 and FIG. 5, the problem mentioned above will be described. FIG. 4 is a block diagram simply showing the structure of the communication device 200. FIG. 5 is a timing chart showing signal waveforms in the communication device. That is, FIG. 5 shows the signal waveforms at terminals A to L shown in FIG. 4. Note that the content shared with FIGS. 1 to 3 will be omitted.

The transmission circuit 210 includes a pulse generation circuit 211 and a pulse generation circuit 212. The pulse generation circuit 211 generates a rising pulse corresponding to the rising edge of an input signal A. That is, the pulse generation circuit 212 generates a falling pulse corresponding to the falling edge of a reception signal A. Therefore, an output from the pulse generation circuit 211 and an output from the pulse generation circuit 212 show waveforms of a signal B and a signal C shown in FIG. 5, respectively.

The signal B from the pulse generation circuit 211 is supplied to one end of the primary side coil 221, and the signal C from the pulse generation circuit 212 is supplied to the other end of the primary side coil 221. As a result, a current corresponding to a differential voltage between the signal B and the signal C flows through the primary side coil 221. Through the primary side coil 221, a current having an opposite polarity between the rising pulse of the signal B and the falling pulse of the signal C flows.

A voltage corresponding to the current that flows through the primary side coil 221 is generated in the secondary side coil 222. In the secondary side coil 222, a voltage with a polarity corresponding to the direction of the current is induced. In the secondary side coil 222, a voltage having the edge information is induced. The voltage generated in the secondary side coil 222 shows a waveform of a voltage D-E shown in FIG. 5. The voltage D-E includes an edge pulse P1 corresponding to the rising edge of the input signal A and an edge pulse P3 corresponding to the falling edge thereof. Immediately after the edge pulse P1 having the positive polarity, a counter pulse P2 having the negative polarity is generated, and immediately after the edge pulse P3 having the negative polarity, a counter pulse P4 having the positive polarity is generated.

In the same way as shown in FIG. 1, to one end of the secondary side coil 222, the filter 223 is connected, and to the other end thereof, the filter 224 is connected. The filter 223 and the filter 224 are high-pass filters that remove common mode noise at a low frequency.

A signal F that passes through the filter 223 and a signal G that passes through the filter 224 are input to the comparators 231 and 232, respectively, in the same way as shown in FIG. 1. Then, the comparator 231 and the comparator 232 separate the edge pulse and the counter pulse for each polarity. An output of the comparator 231 and an output of the comparator 232 are widened by the widening circuits 233 and 234, respectively.

For example, in an isolator applied to an IGBT (Insulated Gate Bipolar Transistor) driver, in association with switching of the IGBT, a difference is generated between reference potentials of a controller-side chip (transmission circuit 210) and an IGBT-side chip (reception circuit 230) by approximately 1 kV. The variation of the reference potentials propagates through an inter-transformer parasitic capacitance, so a common mode noise is mixed in the signal D and signal E. However, generally, the frequency of the noise is lower than a signal component, so the noise can be removed by the filters 223 and 224. In the signal F that has passed through the filter 223 and the signal G that has passed through the filter 224, the edge pulse as a main body of the edge information and the counter pulse having the opposite polarity which is generated immediately after that are mixed. The two comparators 231 and 232 separate the edge pulse and the counter pulse for each polarity.

It should be noted that the filters 223 and 224 also serve a function of determining operation points of the comparators 231 and 232. The edge pulse included in the outputs of the comparators 231 and 232 are widened by the widening circuits 233 and 234.

Signals J and K from the widening circuits 233 and 234 are input to the determination circuit 236. The counter pulse unnecessary for the signal restoration is generated immediately after the edge pulse. For example, the determination circuit 236 determines which is a first corner, and thus the restoration circuit 235 restores the input signal A. The signal is processed on the basis of the first-corner determination logic, with the result that the input signal A is restored to obtain an output signal L.

The above description is a communication principle of the isolator. However, as described above, in the signal D and the signal E from the secondary side coil 222, the common mode noise may be generated. The common mode noise is generated on both the signal D and the signal E in the same way. Therefore, basically, it is possible to remove the common mode noise by a differential structure. However, different amounts of common mode noise may be generated on the signal D and the signal E in some cases. A signal waveform in this case is shown in FIG. 5 in an enlarged manner. As shown in the enlarged diagram of the signal D-E of FIG. 5, when a difference is generated between the common mode noises on the signal D and the signal E, a noise is generated between the counter pulse P2 and the edge pulse P3.

As shown in the enlarged diagram of FIG. 5, the common mode noise also includes a counter component. For example, when the common mode noise having the positive polarity is generated, a counter component having the negative polarity is generated immediately after that. A frequency component of the common mode noise is low, so an amplitude becomes small, but the width of the noise is increased.

In the case where the common mode noise as described above is generated, it may be impossible to lower a threshold value. That is, to detect a reception signal by the reception circuit 230, lowering the threshold value is effective. However, in the case where the common mode noise is generated, when the threshold value is lowered, this responds to the common mode noise. As a result, malfunction of the reception circuit 230 is caused. Such a common mode noise has a low frequency and thus can be removed by the high-pass filter. However, when the noise passes through the high-pass filter of RC, swinging back is caused in the signal waveform.

In the process in which the counter pulse that has passed through the filters 223 and 224 is attenuated, in the waveform, the swinging back may be caused again to the side of the polarity of the edge pulse beyond 0 level in some cases (see, broken line of F-G shown in FIG. 5). The swinging back is caused due to a transient property of the filters 223 and 224 of RC. Because of the swinging back, in the outputs of the comparators 231 and 232 or the outputs of the widening circuits 233 and 234, there is a fear that the pulse width may be increased (see, signals J and K shown in FIG. 5). Therefore, an interval of the input pulses to the determination circuit 236 is reduced. Before the determination circuit 236 terminates the process for the edge pulse and returns to a standby state, if the next edge pulse reaches the circuit, it may be impossible to distinguish the edge pulse from the counter pulse, and thus the signal restoration is mistaken (see, signal L shown in FIG. 5).

As described above, in the case where the swinging back indicated as the broken line of F-G, in the outputs J and K of the widening circuits 233 and 234, the pulse is generated even during a period of the swinging back. Therefore, when the pulse width is increased, pulses are interfered with each other, with the result that the signal restoration is difficult to be performed. In particular, in the case where communication is performed at a high data rate, pulses are easily interfered with each other, so it is difficult to perform the signal restoration. Note that, in Japanese Unexamined Patent Application Publication No. 2001-111390, the swinging back can be attenuated, but the edge pulse is also attenuated. As a result, there is a fear that the restoration circuit 235 may perform erroneous signal restoration.

In view of the above, in this embodiment, the reception circuit initializes the reception signal. Note that the initialization of the reception signal means that the reception signal is attenuated or deleted. This process reliably makes it possible to restore the signal. Therefore, it is possible to reduce a delay and achieve a higher data rate.

First Embodiment

Figure 6:
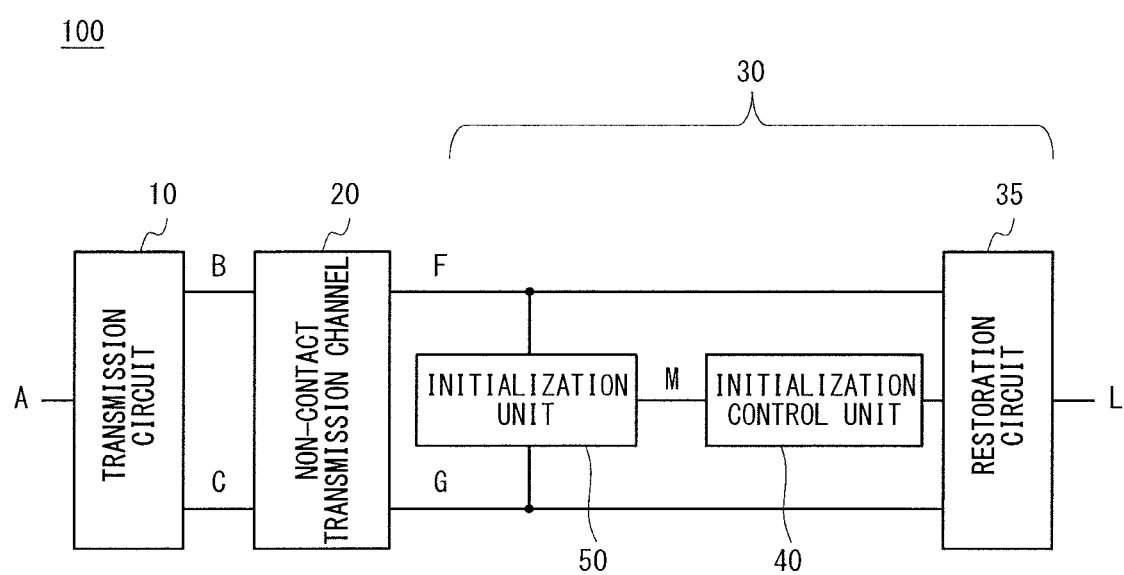
FIG. 6 is a block diagram showing the structure of a communication device according to a first embodiment.
Figure 7:
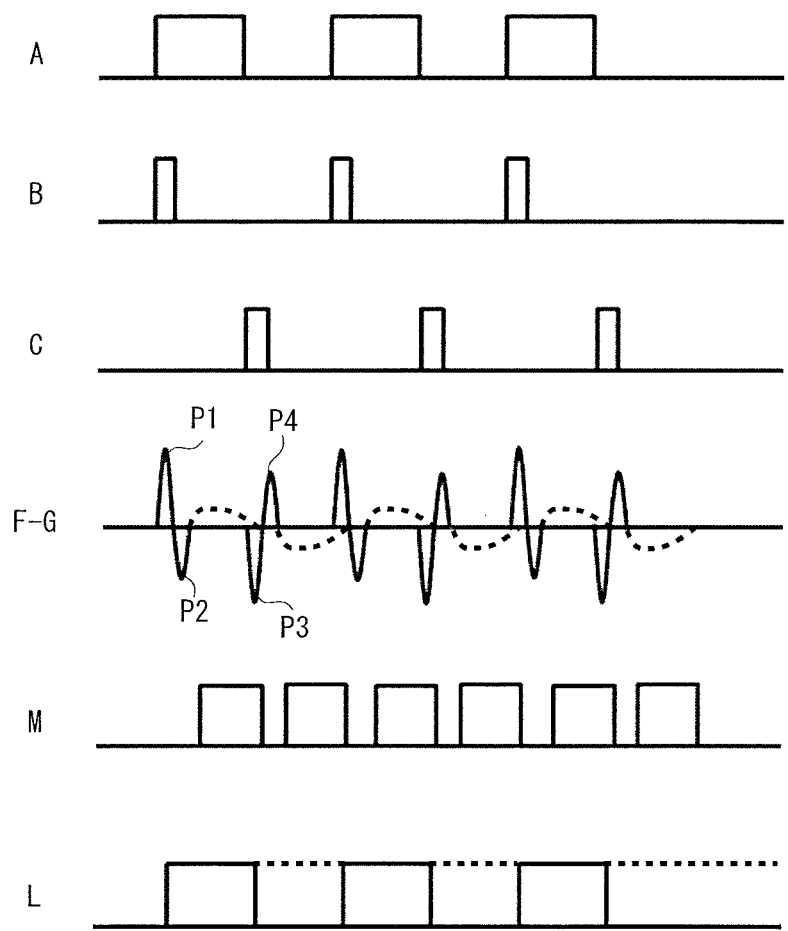
FIG. 7 is a timing chart showing signal waveforms of the communication device according to the first embodiment.

A communication device 100 according to this embodiment will be described with reference to FIG. 6. FIG. 6 is a block diagram showing the structure of the communication device 100. FIG. 7 is a timing chart showing signal waveforms at terminals A to L shown in FIG. 6. The communication device 100 includes a transmission circuit 10, a non-contact transmission channel 20, and a reception circuit 30. The reception circuit 30 includes a restoration circuit 35, an initialization control unit 40, and an initialization unit 50.

Like the communication device 200 shown in FIG. 1, the communication device 100 is a pulse isolator or the like and transmits a signal via the non-contact transmission channel 20. The non-contact transmission channel 20 includes a primary side coil 21 and a secondary side coil 22 that are AC coupling elements. The signal transmitted from the transmission circuit 10 is received by the reception circuit 30 via the non-contact transmission channel 20. The transmission circuit 10, the non-contact transmission channel 20, and the restoration circuit 35 have the same structures as the transmission circuit 210, the non-contact transmission channel 220, and the restoration circuit 235, respectively, shown in FIG. 1 or FIG. 4, so descriptions thereof will be omitted. That is, the reception circuit 30 has the structure in which the initialization control unit 40 and the initialization unit 50 are added to the structure shown in FIG. 1 or FIG. 4. Further, the input signal A and the signals B and C from the transmission circuit 10 are the same as those shown in FIG. 5.

Reception signals F and G received from the transmission circuit 10 via the non-contact transmission channel 20 are input to the restoration circuit 35. The restoration circuit 35 restores the input signal A on the basis of the reception signals F and G. That is, the restoration circuit 35 generates the output signal L corresponding to the input signal A. For the process in the restoration circuit 35, the same process as that shown in FIG. 1 to FIG. 5 can be used. That is, the restoration circuit 35 includes a comparator and a widening circuit.

As shown in FIG. 7, a differential voltage F-G between the signal F and the signal G includes edge pulses (main pulses) P1 and P3 and counter pulses P2 and P4. The restoration circuit 35 transmits a signal to the initialization control unit 40. The initialization control unit 40 distinguishes between a necessary part for the signal restoration and an unnecessary part from the signal and transmits a discrimination result to the initialization unit 50 as an initialization control signal M. In accordance with the initialization control signal M transmitted from the initialization control unit 40, the initialization unit 50 initializes the signal F and the signal G of the non-contact transmission channel 20.

Note that it is necessary to cause a swinging-back component (broken line of F-G) in the differential voltage between the signal F and the signal G from the non-contact transmission channel 20 to avoid interfering with the next edge pulse. For this reason, for example, after the counter pulse P2, the initialization control signal M terminates an initialization instruction before the next edge pulse P3 gets thereto at the latest. At the same time, the capability of the initialization unit 50 is adjusted to cause the signal F and the signal G to be attenuated to such an extent that a signal intensity falls below a lower limit thereof that allows the restoration circuit 35 to be operated by an initialization operation. As a specific example, the initialization control unit 40 includes an OR (logical add) circuit with the signal F and the signal G as inputs. Further, the initialization unit 50 includes a transistor as a switch. Further, the transistor of the initialization unit 50 connects a terminal F and a terminal G on an output side of the non-contact transmission channel 20. By an initialization control signal F from the initialization control unit 40, the transistor switches on/off.

In this embodiment, when the edge pulse of the signal F-G is input to the restoration circuit 35, the initialization control signal M is output from the initialization control unit 40. A condition of outputting the initialization control signal M is that an edge pulse of a signal to be input reaches the restoration circuit 35. For example, after the edge pulse P1 reaches the circuit, all signal components before the next edge pulse P3 reaches the circuit are unnecessary for the restoration operation. To a gate of the transistor of the initialization unit 50, the initialization control signal M from the initialization control unit 40 is input. On the basis of the initialization control signal M, the initialization unit 50 short-circuits the terminal F and the terminal G. By this operation, the initialization unit 50 forcibly attenuates the reception signal unnecessary for the restoration.

As a result, even if an interval between adjacent pulses is reduced, an interference between the pulses becomes unlikely to occur. Thus, it is possible to reduce a delay between the input and the output and achieve a higher data rate. Note that the signal transmitted from the restoration circuit 35 to the initialization control unit 40 may be the very input signal of the restoration circuit 35, for example, in addition to an internal waveform of the restoration circuit 35. Alternatively, it is possible to take the signal from any terminal appropriate to generate the initialization control signal M. Further, the initialization control unit 40 is not limited to the OR circuit. For example, the initialization control unit 40 can be an AND circuit. The initialization unit 50 is not limited to the transistor that connects the terminal F and the terminal G. For example, the initialization unit 50 may be a transistor that individually connects the terminal F and the terminal G with a reference potential.

Figure 8:
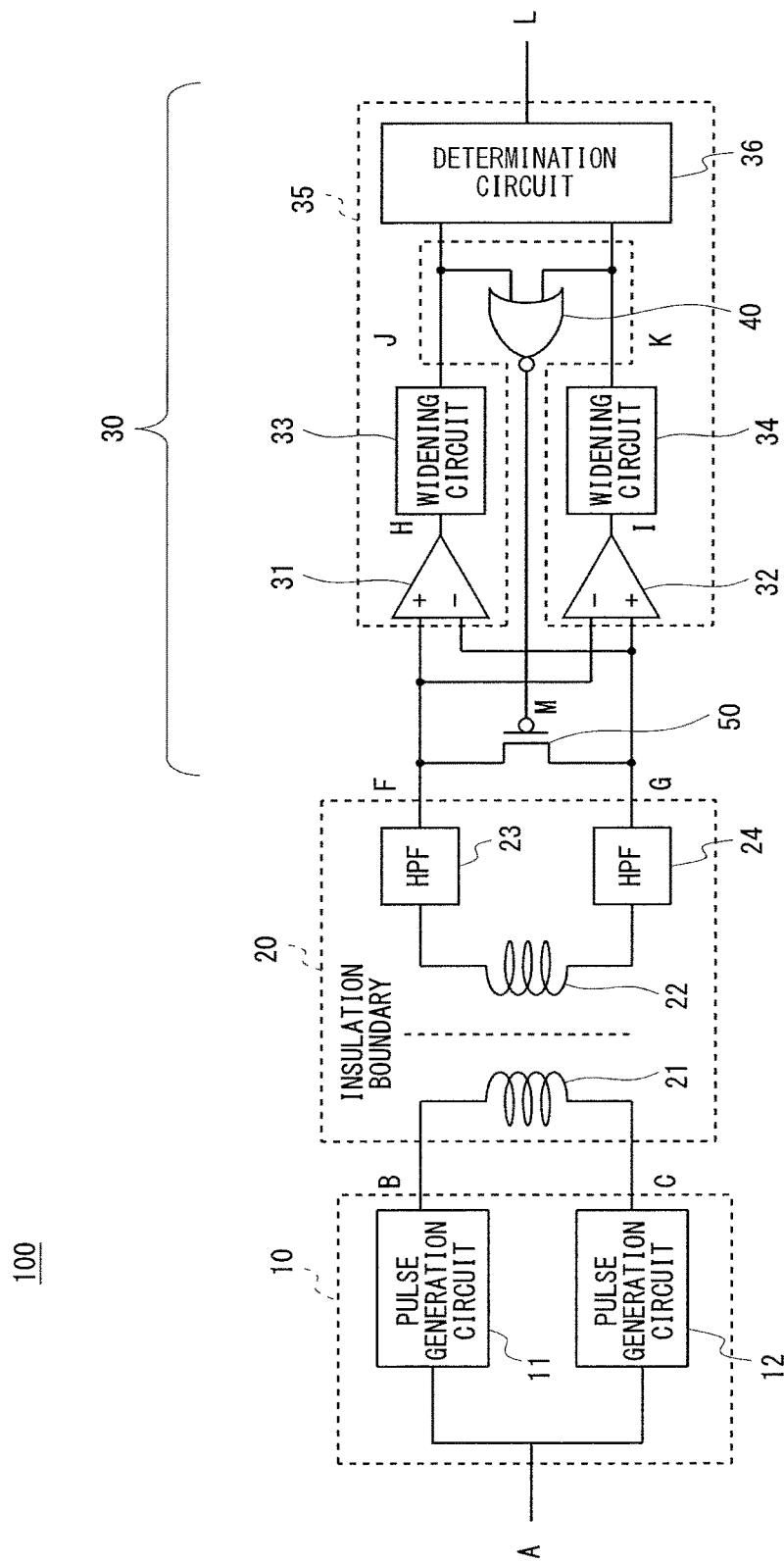
FIG. 8 is a circuit diagram showing an example of the structure of the communication device according to the first embodiment.
Figure 9:
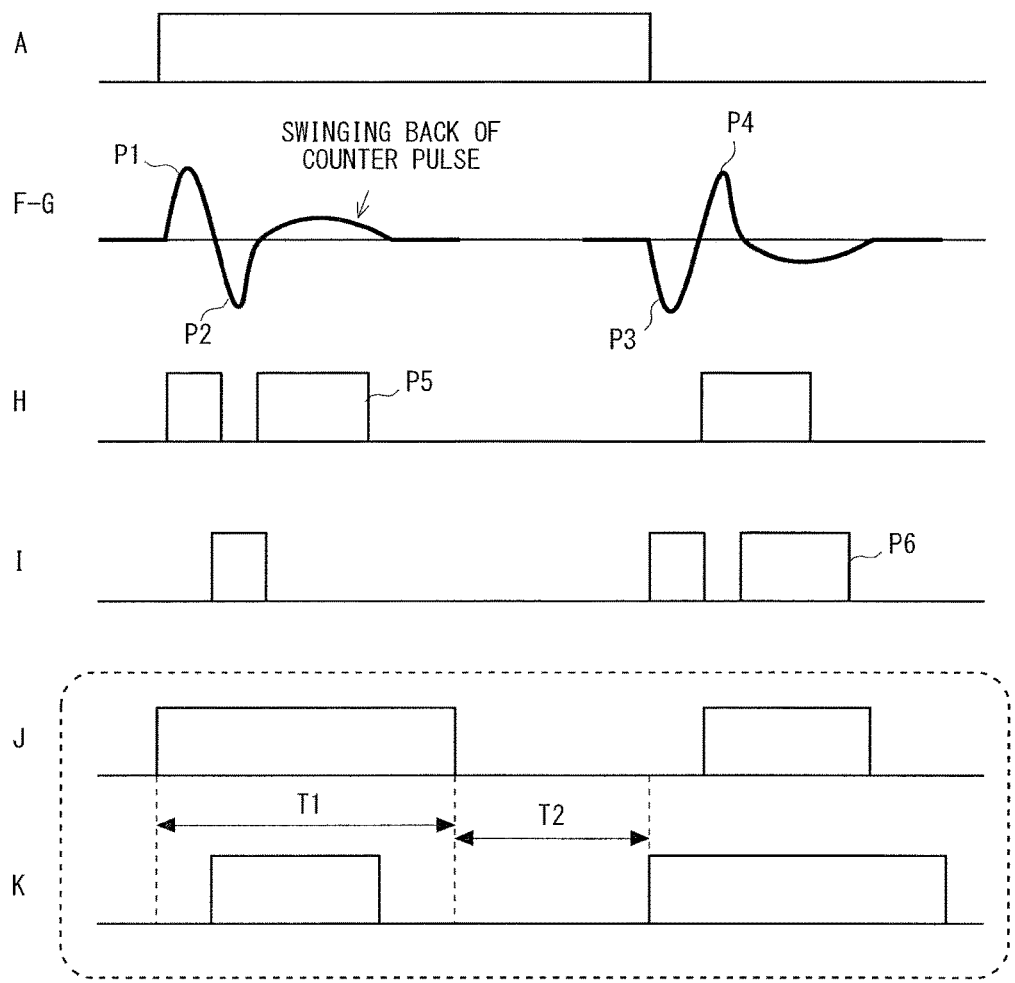
FIG. 9 is a timing chart showing signal waveforms in a case where initialization is not performed.
Figure 10:
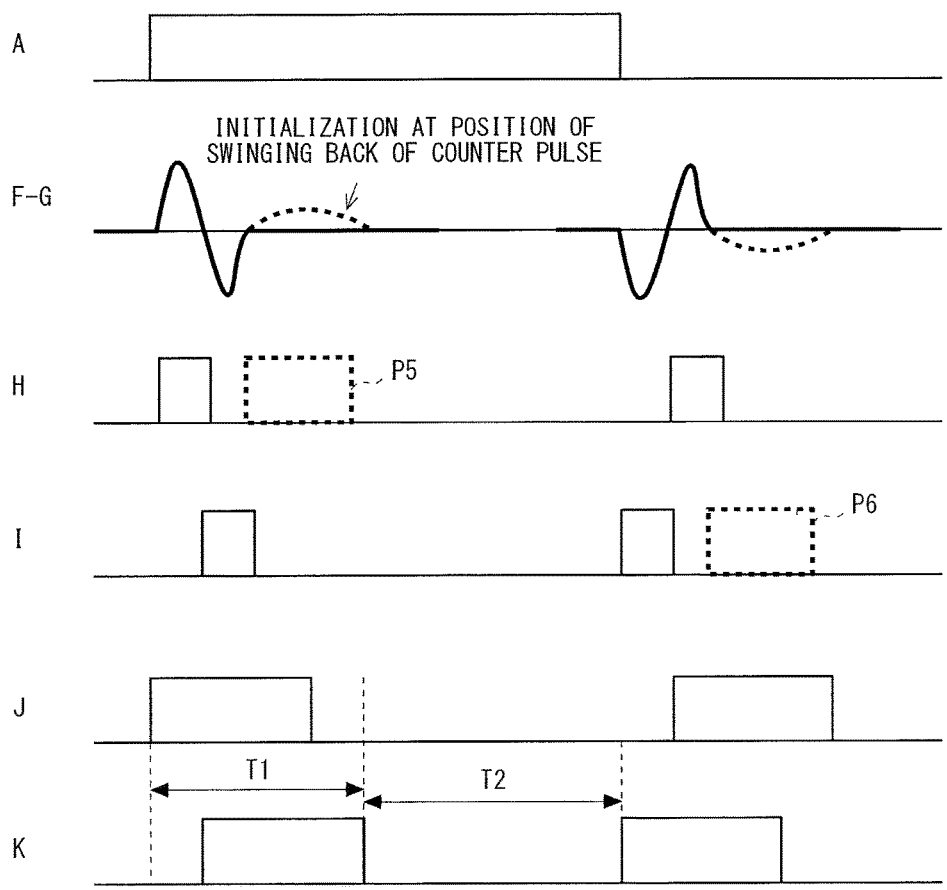
FIG. 10 is a timing chart showing signal waveforms in a case where the initialization is performed.

Subsequently, detailed structures and operations of the non-contact transmission channel 20 and the reception circuit 30 of the communication device 100 according to this embodiment will be described with reference to FIG. 8 to FIG. 10. FIG. 8 is a circuit diagram showing an example of the structure of the communication device 100. FIG. 9 is a timing chart showing signal waveforms in the case where the initialization is not performed. FIG. 10 is a timing chart showing signal waveforms in the case where the initialization is performed.

The transmission circuit 10 includes an edge generation circuit 11 and an edge generation circuit 12. The edge generation circuit 11 detects a rising edge of a pulse included in the input signal A and generates an edge pulse corresponding to the detected rising edge. The edge generation circuit 11 detects a falling edge of a pulse included in the input signal A and generates an edge pulse corresponding to the detected falling edge.

From the transmission circuit 10, the signal B and the signal C are transmitted to the non-contact transmission channel 20. The non-contact transmission channel 20 includes the primary side coil 21 and the secondary side coil 22. The primary side coil 21 and the secondary side coil 22 are insulation transformers with an insulation boundary intervened therebetween. That is, the primary side coil 21 and the secondary side coil 22 are AC coupling elements that are AC-coupled. To one end of the primary side coil 21, the signal B is supplied, and to the other end thereof, the signal C is supplied. Therefore, a current corresponding to a differential voltage between the signal B and the signal C flows through the primary side coil 21. At timing of a rising edge of an input signal IN or a falling edge thereof, a pulse-like current flows through the primary side coil 21. Further, a direction of the current that flows through the primary side coil 21 at the rising edge of the input signal IN is opposite to a direction of a current that flows through the primary side coil 21 at the falling edge. Thus, it is possible to convert edge information of the input signal A to the polarity of the transmission pulse.

Thus, in the secondary side coil 22, a differential voltage corresponding to the current that flows through the primary side coil 21 is induced. In a differential signal F-G, an edge pulse corresponding to the edge of the input signal IN and a counter pulse that appears immediately after the edge pulse exist. The polarity of the counter pulse is opposite to that of the edge pulse. In the differential signal F-G, the edge pulse P1 having the positive polarity corresponding to the rising edge of the input signal IN and the edge pulse P3 having the negative polarity corresponding to the falling edge of the input signal IN exist. Further, immediately after the edge pulse P1 having the positive polarity, the counter pulse P2 having the negative polarity exists, and immediately after the edge pulse P3 having the negative polarity, the counter pulse P4 having the positive polarity exists.

One end of the secondary side coil 22 is connected to a filter 23, and the other end thereof is connected to a filter 24. The filter 23 and the filter 24 are high-pass filters (HPF) includes R and C, for example. The filter 23 and the filter 24 remove a noise component from a reception pulse received via the non-contact transmission channel 20. The signal F and the signal G that have passed through the filter 23 and 24 are output to the reception circuit 30.

The reception circuit 30 includes the restoration circuit 35, the initialization control unit 40, and the initialization unit 50. The restoration circuit 35 includes comparators 31 and 32, widening circuits 33 and 34, and a determination circuit 36. In the comparator 31, the signal F that has passed through the filter 23 is input to the non-inverting input terminal, and the signal G that has passed through the filter 24 is input to the inverting input terminal. Therefore, the comparator 31 detects a pulse having the positive polarity in the differential voltage F-G. An output of the comparator 31 shows a waveform of a signal H shown in FIGS. 9 and 10. In the comparator 32, the signal F that has passed through the filter 23 is input to the inverting input terminal, and the signal G that has passed through the filter 24 is input to the non-inverting input terminal. Therefore, the comparator 32 detects a pulse having the negative polarity in the differential voltage F-G. An output of the comparator 32 shows a waveform of a signal I shown in FIGS. 9 and 10. The comparators 31 and 32 are differential amplifiers with both ends of the secondary side coil 22 as differential inputs.

The signal H from the comparator 31 is input to the widening circuit 33. The signal I from the comparator 32 is input to the widening circuit 34. The widening circuit 33 and the widening circuit 34 increase pulse widths of the input signals H and I, respectively. That is, the widening circuit 33 and the widening circuit 34 are delay circuits that output the rising edge at a high speed and delay and output the falling edge. With this structure, it is possible to delay the falling edge of the pulse. Therefore, the widening circuit 33 increases and outputs the pulse width of the pulse of the signal H as a signal J to the determination circuit 36. The widening circuit 34 increases the pulse width of the pulse of the signal I and outputs the pulse as a signal K to the determination circuit 36. The output from the widening circuit 33 and the output from the widening circuit 34 show signal waveforms of the signal J and the signal K shown in FIGS. 9 and 10, respectively.

The widening circuits 33 and 34 respectively output the signal J and signal K to the determination circuit 36. The determination circuit 36 includes a logic circuit that determines which pulse get thereto first. That is, the determination circuit 36 determines which pulse of the signal J and the signal K gets thereto first. The determination circuit 36 has the same structure as the determination circuit 236 shown in FIG. 1, so a description thereof will be omitted.

The initialization control unit 40 includes an OR circuit. Specifically, the initialization control unit 40 is a NOR circuit. To the initialization control unit 40, the signal J and the signal K are input. That is, the initialization control unit 40 outputs NOR of the signal J and the signal K as the initialization control signal M to the initialization unit 50.

The initialization unit 50 has a transistor disposed between the terminal F and the terminal G. More specifically, a source of a Pch transistor is connected to the terminal F and a drain thereof is connected to the terminal G. The initialization control signal M from the initialization control unit 40 is input to a gate of the transistor. Therefore, on the basis of the initialization control signal M, the transistor is subjected to on/off control. When the transistor as a switch is turned on, the terminal F and the terminal G are short-circuited.

In the differential voltage F-G, swinging back of the counter pulse occurs (see, signal F-G shown in FIG. 9 and FIG. 10). In the case where the initialization is not performed, due to the swinging back, for the signal H and signal I, pulses P5 and P6 unnecessary for the restoration are generated (see, signal H and signal I shown in FIG. 9).

In the case where the initialization is not performed, when the pulses of the signal H and the signal I are widened, the signal J and the signal K are unnecessarily extended. For example, as shown in FIG. 9, a period T1 is extended, a period T2 is shortened. The period T1 is such a period that OR of the signal J and the signal K becomes Hi and is a minimum required forbidden area for the signal restoration. On the basis of the period T1, a limit of a delay reduction is determined. Further, the period T2 is such a period that OR of the signal J and the signal K becomes Lo and is a timing margin to make it possible to recognize the next edge.

On the other hand, in the case where the initialization is performed, at a timing of the swinging back of the counter pulses P2 and P4, the initialization is performed. As shown in FIG. 10, the pulses P5 and P6 unnecessary for the signal restoration are removed from the signal H and the signal I. When the widening circuits 33 and 34 widen the pulses of the signal H and the signal I, the signal J and the signal K show waveforms as shown in FIG. 10. The period T1 in which OR of the signal J and the signal K becomes Hi becomes shorter as compared to the case where the initialization is not performed. Therefore, it is possible to shorten the forbidden area and reduce a delay time of the pulse. It is possible to extend the period T2 in which OR of the signal J and the signal K becomes Lo, and the timing margin for recognizing the edge is increased. That is, it is possible to suppress a reduction of a timing margin and restore the signal with high accuracy.

In this way, by providing the initialization control unit 40 and the initialization unit 50 on the reception circuit 30 side, it is possible to reliably restore the signal. For example, the initialization control unit 40 detects a necessary part and an unnecessary part from the reception signal, and on the basis of the detection result, outputs an initialization control signal to the initialization unit 50. On the basis of the initialization control signal, the initialization unit 50 initializes the reception signal. As a result, during a certain period after the edge pulse, the signal F and the signal G are initialized. It is possible to remove the unnecessary pulses P5 and P6 generated after the counter pulse due to the swinging back. Therefore, it is possible shorten the period T1 that is minimum required for the signal recovery, and shorten the delay. Further, it is possible to achieve the higher data rate.

Further, the initialization unit 50 includes a transistor that is on/off controlled by the initialization control signal M. With this structure, the initialization unit 50 can start or terminate the initialization at an appropriate timing. The transistor of the initialization unit 50 electrically connects the terminal F with the terminal G. As a result, it is possible to simplify the circuit structure. Further, by using the OR circuit for the initialization control unit 40, it is possible to simplify the circuit structure. Of course, the structure of the initialization control unit 40 is not limited to the OR circuit, and an AND circuit may be used therefor.

Second Embodiment

Figure 11:
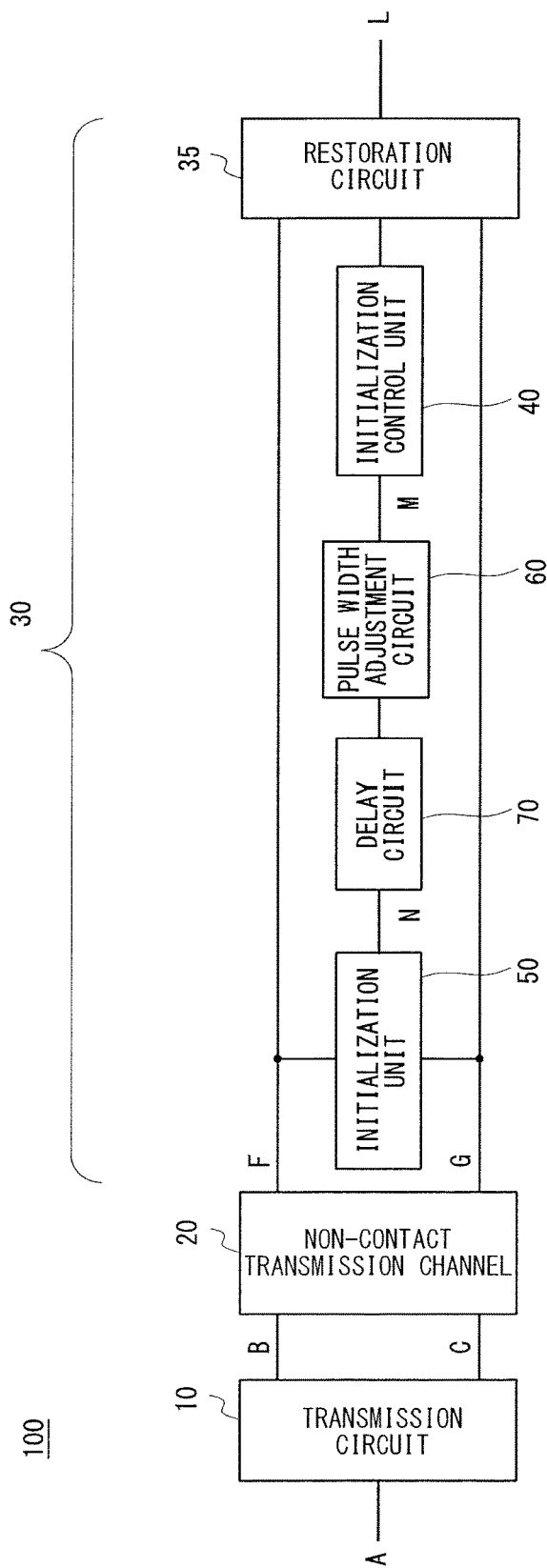
FIG. 11 is a block diagram showing the structure of a communication device according to a second embodiment.

The communication device 100 according to this embodiment will be described with reference to FIG. 11. FIG. 11 is a block diagram showing the structure of the communication device 100 according to this embodiment. In this embodiment, a pulse width adjustment circuit 60 and a delay circuit 70 are additionally provided with respect to the structure in the first embodiment. Note that the structure except the pulse width adjustment circuit 60 and the delay circuit 70 are the same as the structure in the first embodiment, so a description thereof will be omitted as appropriate.

The pulse width adjustment circuit 60 and the delay circuit 70 are disposed between the initialization control unit 40 and the initialization unit 50. The pulse width adjustment circuit 60 adjusts a pulse width of the initialization control signal generated by the initialization control unit 40. The delay circuit 70 delays an initialization control signal adjusted by the pulse width adjustment circuit 60. Then, an initialization control signal N delayed by the delay circuit 70 is input to the initialization unit 50. On the basis of the initialization control signal N, the initialization unit 50 short-circuits the terminal F and the terminal G, thereby performing the initialization of the signal F and the signal G. As a result, it is possible to obtain the same effect as the first embodiment.

Further, in this embodiment, by providing the pulse width adjustment circuit 60, it is possible to adjust a period during which the initialization is performed. Further, by providing the delay circuit 70, it is possible to adjust a timing when the initialization is started. Thus, it is possible to optimize the timing when the initialization unit 50 performs the initialization and the period therefor, with the result that the signal can be more reliably restored. As a result, it is possible to shorten the delay and achieve the higher data rate.

In the first embodiment, the initialization operation in the initialization unit 50 is performed on the basis of the initialization control signal M from the initialization control unit 40. That is, in accordance with an instruction of the initialization control signal M, the initialization unit 50 turns the transistor on. Therefore, in the case where the initialization period is insufficient, the pulse width adjustment circuit 60 extends the pulse width of the initialization control signal M. In contrast, in the case where the initialization period is excessive, the pulse width adjustment circuit 60 reduces the pulse width of the initialization control signal M. In this way, the pulse width adjustment circuit 60 can arbitrarily set the pulse width.

Similarly, in the case where the timing when the initialization is started is too fast, the delay circuit 70 sets the delay time to be longer, thereby delaying an arrival time of the pulse of the initialization control signal M. In contrast, in the case where the timing when the initialization is started is too late, the delay circuit 70 reduces the delay time, thereby bringing the arrival time of the initialization pulse forward. In this way, the delay circuit 70 can arbitrarily set the initialization start timing.

Figure 12:
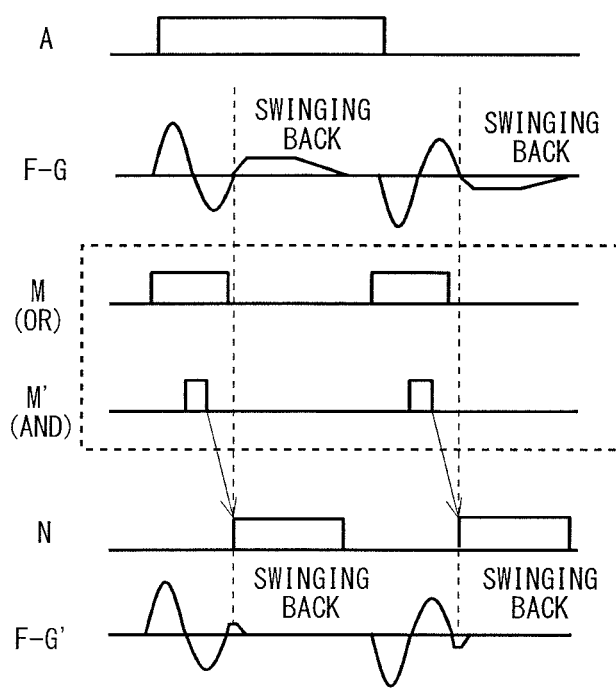
FIG. 12 is a timing chart showing signal waveforms of the communication device according to the second embodiment.

Signal waveforms output from the pulse width adjustment circuit 60 and the delay circuit 70 will be described with reference to FIG. 12. FIG. 12 is a timing chart showing waveforms at terminals M and N of the communication device 100 and a waveform of a differential voltage of F-G. Note that, in FIG. 12, F-G shows the signal waveform in the case where the initialization is not performed, and F-G' shows a signal waveform in the case where the initialization is performed. Further, in FIG. 12, M shows a signal waveform in the case where the initialization control unit 40 is the OR circuit, and M' shows a signal waveform in the case where the initialization control unit 40 is the AND circuit.

As indicated by M and M' shown in FIG. 12, depending on the structure of the initialization control unit 40, the pulse width and the timing of the initialization control signal differs. In order to appropriately perform the initialization, it is necessary to output such a pulse as to be timed to the swinging back of the differential voltage F-G to the initialization unit 50. Therefore, the pulse width adjustment circuit 60 and the delay circuit 70 adjust the pulse width and the timing of the initialization control signal M, with the result that the initialization control signal N shown as N in FIG. 12 is supplied to the initialization unit 50.

By the initialization control signal N shown in FIG. 12, the transistor of the initialization unit 50 is subjected to the on/off control. As a result, like the signal F-G' shown in FIG. 12, the swing back of the differential voltage can be appropriately attenuated or deleted. Thus, it is possible to reliably restore the input signal A from the signal L (not shown in FIG. 12).

Note that, in FIG. 11, the pulse width adjustment circuit 60 and the delay circuit 70 are disposed between the initialization control unit 40 and the initialization unit 50, but the structure and the arrangement of the pulse width adjustment circuit 60 and the delay circuit 70 are not limited to those of FIG. 11. For example, the structure is not limited to the structure in which the pulse width adjustment circuit 60 and the delay circuit 70 are provided independently of the restoration circuit 35, but can use a part of the restoration circuit 35. For example, the widening circuits 233 and 234 as shown in FIG. 1 or the widening circuits 33 and 34 as shown in FIG. 8 can be partly used to structure the pulse width adjustment circuit 60 and the delay circuit 70. That is, the pulse width adjustment circuit 60 and the delay circuit 70 may be provided on a former stage of the initialization control unit 40.

Figure 13:
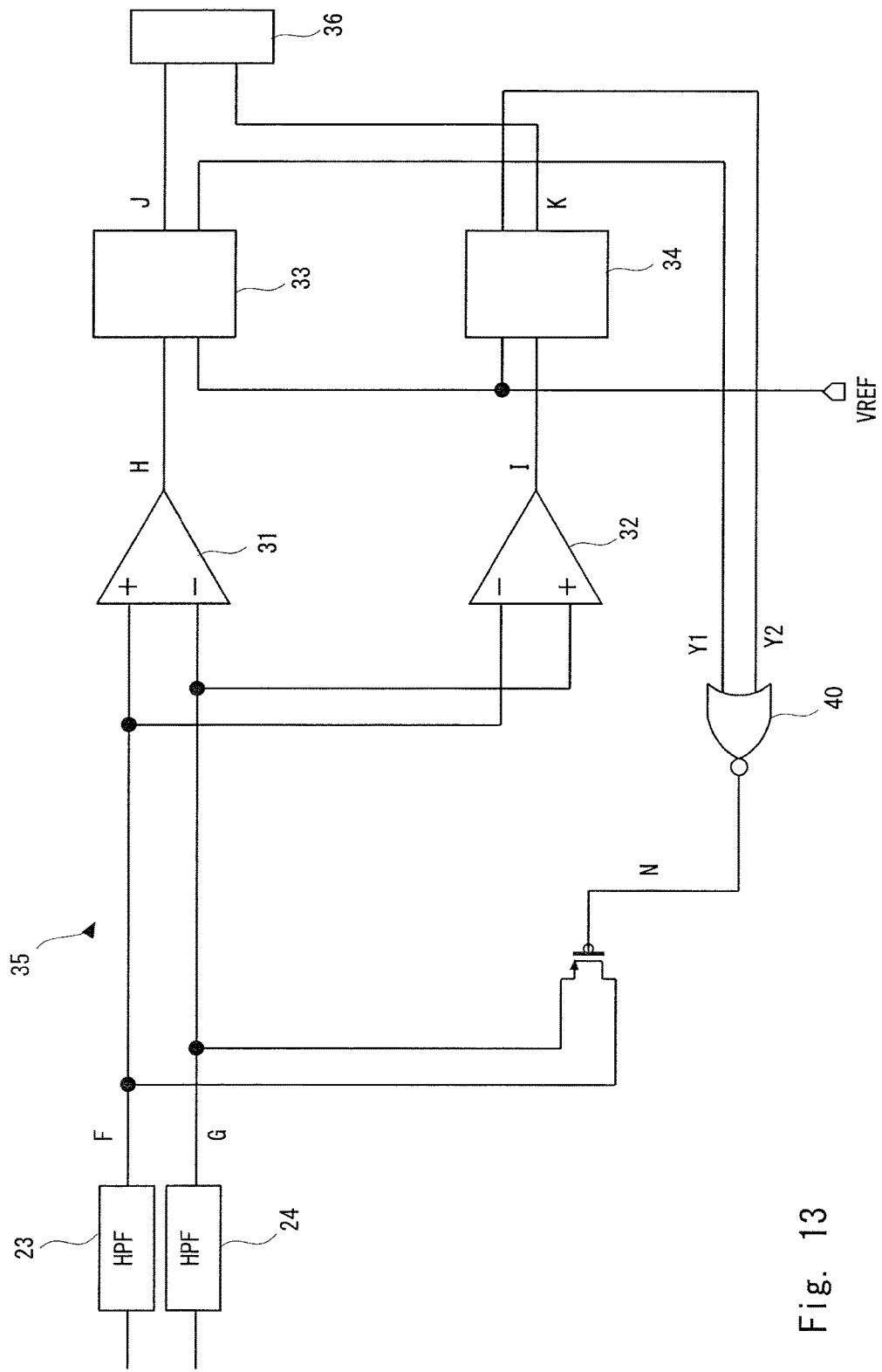
FIG. 13 is a diagram showing an example of the structure of a main part in the communication device according to the second embodiment.
Figure 14:
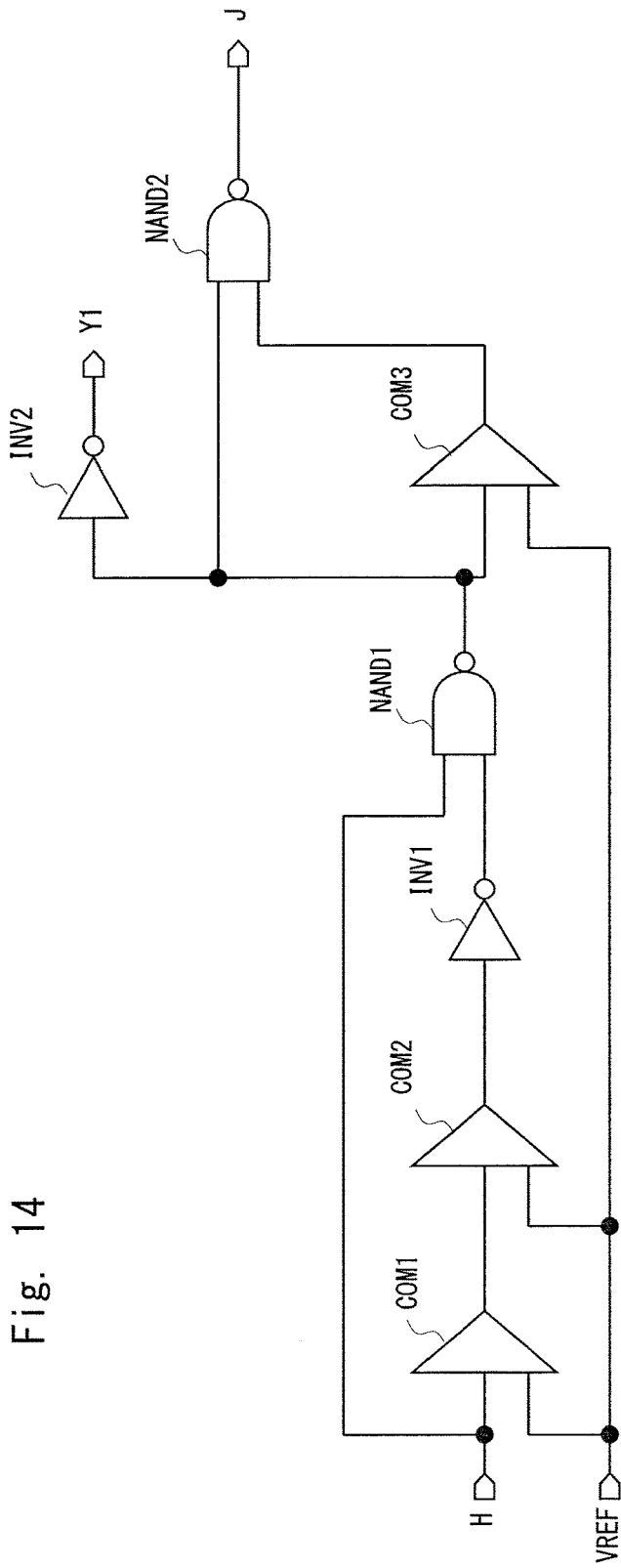
FIG. 14 is a circuit diagram showing an example of the structure of a widening circuit.
Figure 15:
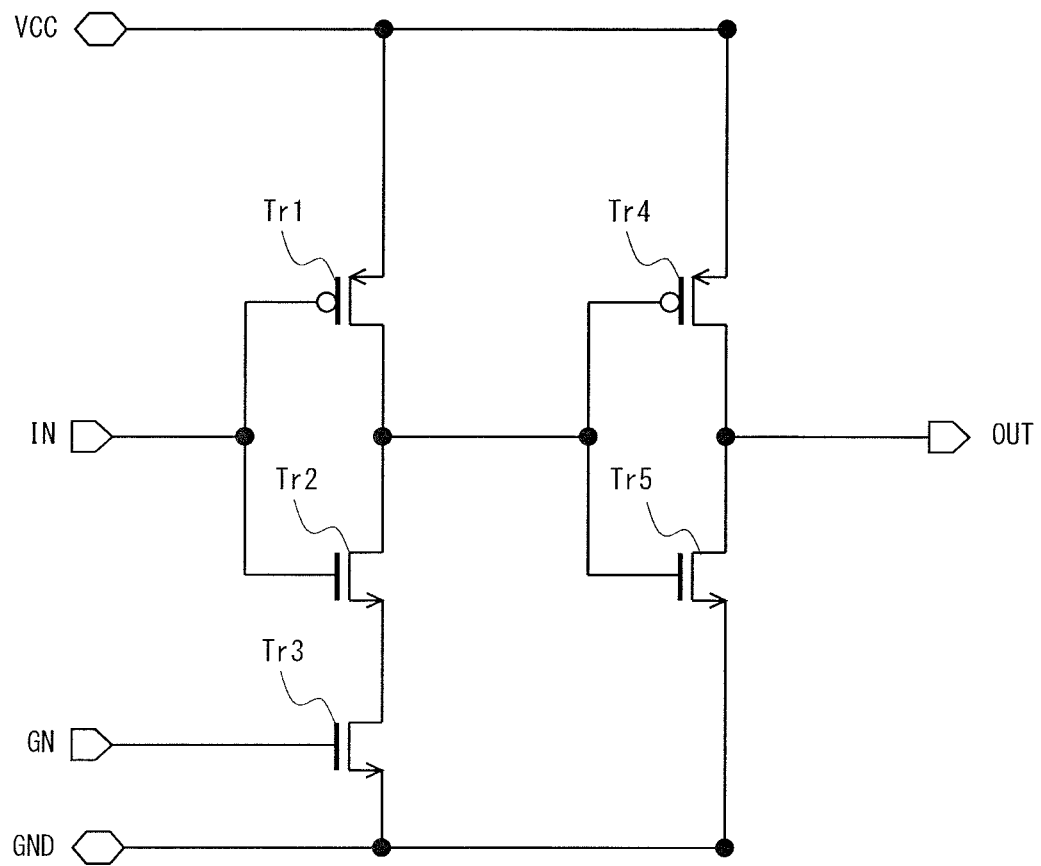
FIG. 15 is a circuit diagram showing an example of the structure of a comparator.

Here, with reference to FIG. 13 to FIG. 15, the structure in which a part of the widening circuits 33 and 34 is used as the pulse width adjustment circuit 60 and the delay circuit 70 will be described. FIG. 13 is a circuit diagram showing a part of the reception circuit 30. FIG. 14 is a circuit diagram showing the structure of the widening circuits 33 and 34 provided to the reception circuit 30. FIG. 15 is a circuit diagram showing a transistor structure of a comparator provided to the widening circuits 33 and 34.

First, the structure of main parts of the communication device 100 will be described with reference to FIG. 13. FIG. 13 is a diagram showing the circuit structure from the HPFs 23 and 24 to the determination circuit 36. Note that the structure of the main parts of the communication device 100 is the same as above, so a description thereof will be omitted as appropriate.

As in the structure shown in FIG. 8, the signals H and J from the comparators 31 and 32 are input to the widening circuits 33 and 34, respectively. Further, to the widening circuits 33 and 34, a reference voltage VREF is input. The widening circuits 33 and 34 use the reference voltage VREF to increase the pulse width. The widening circuit 33 outputs a signal Y1 to the initialization control unit 40 and outputs the signal J to the determination circuit 36. The widening circuit 34 outputs a signal Y2 to the initialization control unit 40 and outputs the signal K to the determination circuit 36. The determination circuit 36 has the same structure as shown in FIG. 1. Then, the determination circuit 36 determines which of the signal J and the signal K gets thereto first. Then, on the basis of the determination result of the determination circuit 36, the input signal is restored.

The initialization control unit 40 is the NOR circuit as in FIG. 8. The initialization control unit 40 outputs NOR of the signal Y1 and the signal Y2 to the initialization unit 50 as the initialization control signal N. The initialization unit 50 includes a Pch transistor as in FIG. 8. A source of the transistor of the initialization unit 50 is connected to the terminal G, and a drain thereof is connected to the terminal F. To a gate of the transistor of the initialization unit 50, the initialization control signal N is input.

The structures of the widening circuits 33 and 34 are shown in FIG. 14. Note that the structures of the widening circuits 33 and 34 are the same, so a description will be given on the assumption that the circuit shown in FIG. 14 is the widening circuit 33. In other words, the widening circuit 34 has the same circuit structure as that shown in FIG. 14, and to the widening circuit 34, the signal I is input instead of the signal H. The widening circuit 34 outputs the signal K instead of the signal J and outputs the signal Y2 instead of the signal Y1.

To the widening circuit 33, the signal H and the reference voltage VREF are input. The widening circuit 33 has comparators COM1 to COM3, inverters INV1 and INV2, and NAND circuits NAND1 and NAND2. The reference voltage VREF is input to the comparators COM1 to COM3.

The comparator COM1 compares the signal H with the reference voltage VREF. The comparator COM1 outputs a comparison signal that indicates a comparison result to the comparator COM2. The comparator COM2 compares the output of the comparator COM1 with the reference voltage VREF. The comparator COM2 outputs a comparison signal to the NAND circuit NAND1 via the inverter INV1. The NAND circuit NAND1 outputs NAND of the signal H and the output signal of the inverter INV1 to the inverter INV2, the comparator COM3, and the NAND circuit NAND2.

The inverter INV2 inverts the signal from the NAND circuit NAND1 and outputs the inverted signal as the signal Y1. The comparator COM3 compares the signal from the NAND circuit NAND1 with the reference voltage VREF. Then, the comparator COM3 outputs a comparison signal to the NAND circuit NAND2. The NAND circuit NAND2 outputs NAND of the signal from the NAND circuit NAND1 and the signal from the comparator COM3 as the signal J.

Therefore, the comparators COM1 and COM2, the inverter INV1, and the NAND circuit NAND1 are common to the widening circuit 33 and the pulse width adjustment circuit 60. That is, the widening circuit 33 and the pulse width adjustment circuit 60 share the comparators COM1 and COM2, the inverter INV1, and the NAND circuit NAND1.

Here, the structures of the comparators COM1 and COM2 are shown in FIG. 15. Note that the structures of the comparators COM1 and COM2 are the same, so a description will be given on the assumption that the circuit shown in FIG. 15 is the comparator COM1.

The comparator COM1 includes transistors Tr1 to Tr5. The transistors Tr1 and Tr4 are Pch transistors. The transistor Tr2, Tr3, and Tr5 are Nch transistors. Between a power supply voltage VCC and a ground GND, the transistors Tr1 to Tr3 are connected in series with one another.

Specifically, to a source of the transistor Tr1, the power supply voltage VCC is supplied. A drain of the transistor Tr1 and a drain of the transistor Tr2 are connected with each other. A source of the transistor Tr2 and a drain of the transistor Tr3 are connected with each other. A source of the transistor Tr3 is connected to the ground GND. To a gate of the transistor Tr1 and a gate of the transistor Tr2, the signal H is input. To a gate of the transistor Tr3, a signal GN is input. The signal GN is the reference voltage VREF.

Between the power supply voltage VCC and the ground GND, the transistors Tr4 and Tr5 are connected in series with each other. Specifically, to a source of the transistor Tr4, the power supply voltage VCC is supplied. A drain of the transistor Tr4 and a drain of the transistor Tr5 are connected with each other. A source of the transistor Tr5 is connected to the ground GND. A voltage between the drain of the transistor Tr1 and the drain of the transistor Tr2 is input to a gate of the transistor Tr4 and a gate of the transistor Tr5. A voltage between the drain of the transistor Tr4 and the drain of the transistor Tr5 is output as an output signal OUT. That is, when the assumption is made that the circuit shown in FIG. 15 is the comparator COM1, the output signal OUT is output to the comparator COM2. When the assumption is made that the circuit shown in FIG. 15 is the comparator COM2, the output signal OUT is output to the inverter INV1.

With this structure, to the initialization control unit 40, the signals J and K that have been subjected to the pulse width adjustment are input. Thus, the initialization unit 50 performs initialization for the signal F and the signal G at an appropriate timing. As a result, it is possible to adjust a timing of starting the initialization operation and an initialization period appropriately.

As described above, by using a part of the restoration circuit 35, the pulse width and the timing can be adjusted. That is, the pulse width adjustment circuit 60 and the delay circuit 70 share a part of the restoration circuit 35. With this structure, it is possible to simplify a circuit to be added to adjust the pulse width and the timing. Therefore, the circuit structure can be simplified. Note that the structure of the circuit for adjusting the timing and the pulse width the initialization control signal N is not limited to the above structure. That is, it is only necessary to provide a circuit capable of adjusting the timing when the initialization is performed and the initialization period to the reception side.

Third Embodiment

Figure 16:
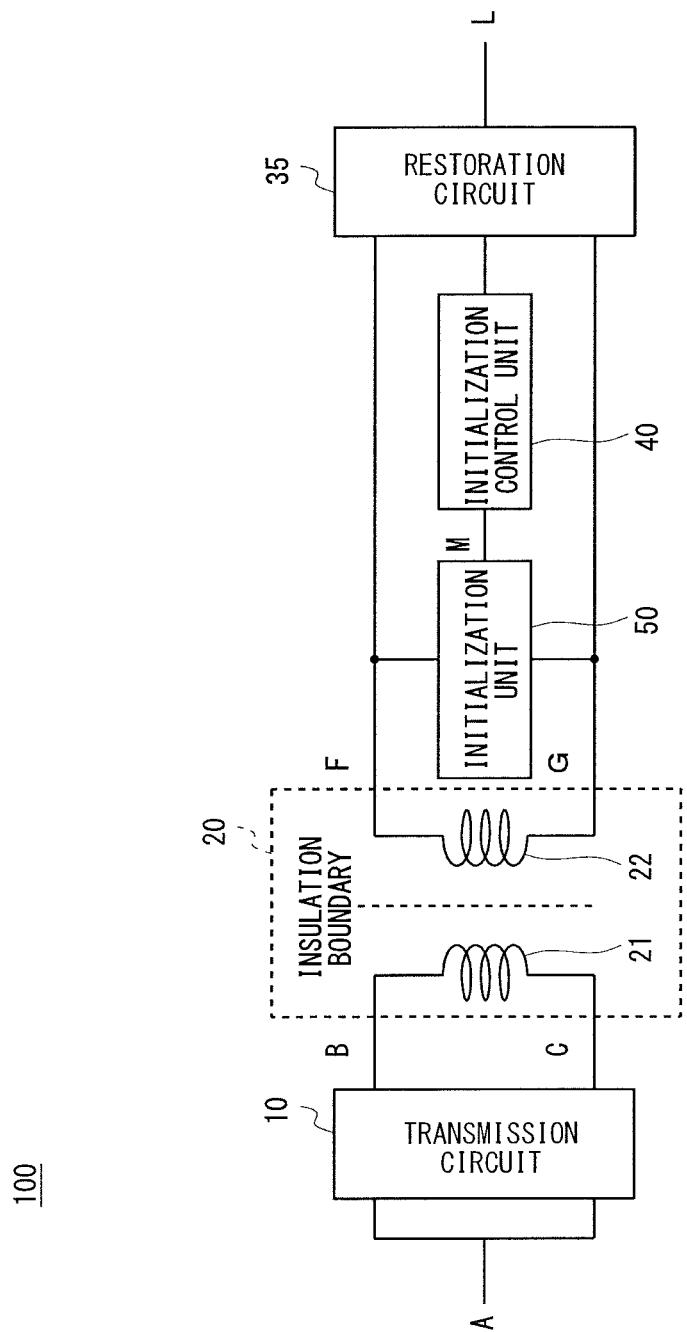
FIG. 16 is a block diagram showing the structure of a communication device according to a third embodiment.

The communication device 100 according to this embodiment will be described with reference to FIG. 16. FIG. 16 is a block diagram showing the structure of the communication device 100. In this embodiment, the filters 23 and 24 are not provided to the non-contact transmission channel 20. That is, to the secondary side coil 22, the initialization unit 50 is directly connected. Note that the structure except the non-contact transmission channel 20 is the same as the above embodiments, so a description thereof will be omitted as appropriate.

The communication device 100 includes the transmission circuit 10, the non-contact transmission channel 20, the restoration circuit 35, the initialization control unit 40, and the initialization unit 50. The transmission circuit 10 converts the input signal A into a pulse. The non-contact transmission channel 20 has the primary side coil 21 and the secondary side coil 22 as the AC coupling elements. The non-contact transmission channel 20 transmits the pulse from the transmission circuit 10 in a non-contact manner. On the basis of the reception signals F and G corresponding to the pulses transmitted through the non-contact transmission channel 20, the restoration circuit 35 restores the input signal A. The initialization unit 50 initializes an output of the non-contact transmission channel 20. On the basis of a reception signal corresponding to the pulse received through the non-contact transmission channel 20, the initialization control unit 40 outputs a control signal that controls the initialization unit 50.

Figure 17:
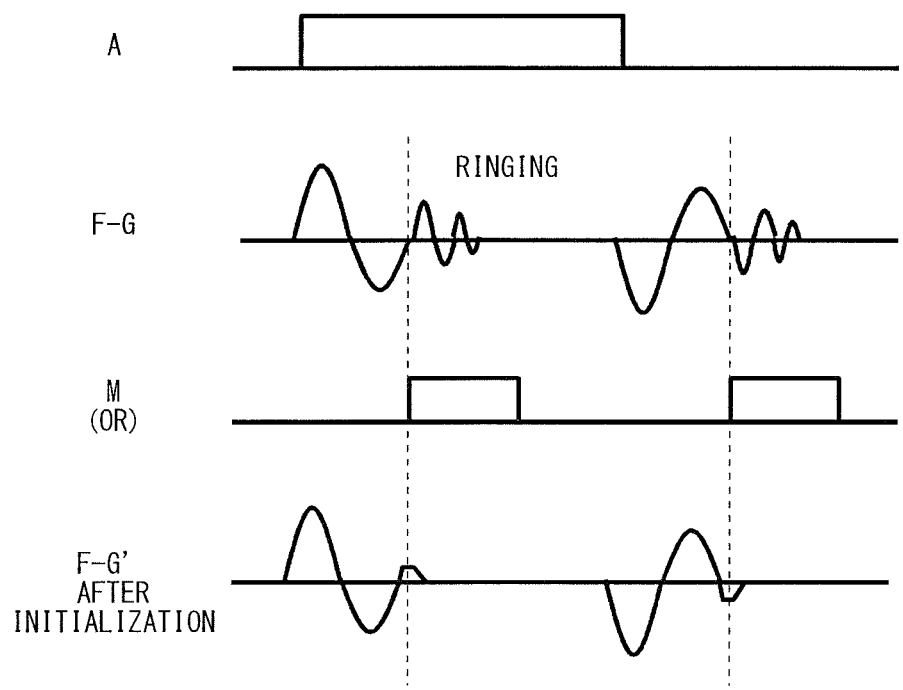
FIG. 17 is a timing chart showing signal waveforms of the communication device according to the third embodiment.

An example of signal waveforms of the communication device 100 is shown in FIG. 17. FIG. 17 is a timing chart showing signal waveforms at terminals. As described above, in order to prevent a timing margin between edge pulses input to the restoration circuit 35 from being reduced, the initialization unit 50 performs initialization. In the case where the non-contact transmission channel 20 does not include the filters 23 and 24, the swinging back of the counter pulse that causes a reduction of the timing margin is not generated. However, even in the case where the swinging back due to a transient property of the counter pulse is not generated, a ringing may occur in the differential voltage F-G (see, F-G shown in FIG. 17). For example, due to the ringing of the reception signal caused by an inductance of the secondary side coil 22, the timing margin is also reduced. In this case, as shown in FIG. 7, the initialization is performed immediately after the secondary side coil 22, with the result that it is possible to suppress the reduction of the timing margin.

Therefore, as in the first embodiment, on the basis of the signal from the restoration circuit 35, the initialization control unit 40 generates the initialization control signal M (see, M shown in FIG. 17). Then, when the initialization unit 50 performs the initialization for the signal F and the signal G on the basis of the initialization control signal M, the differential voltage F-G' after the initialization shows a waveform of F-G' of FIG. 17. As a result, it is possible to obtain the same effect as the first embodiment.

Note that, as a non-contact transmission system, there are various methods for the signal restoration. For example, (1) the signal restoration based on the pulse polarity as described in the first embodiment, (2) signal restoration based on a pulse count, (3) signal restoration by a Set/Reset circuit, and the like can be provided. The operation of the signal initialization according to this embodiment can be used for any one of the above items (1) to (3). This point will be described as follows.

(1) Signal Restoration Based on Pulse Polarity

Figure 18:
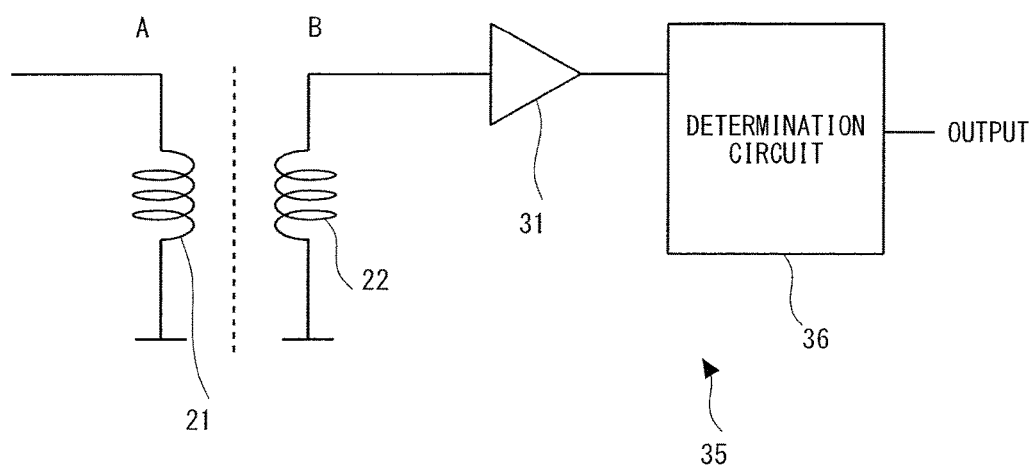
FIG. 18 is a diagram simply showing the structure of restoring a signal in accordance with a pulse polarity.

An example of the structure of restoring a signal on the basis of the pulse polarity is shown in FIG. 18. FIG. 18 is a diagram simply showing a circuit structure in which the signal is restored on the basis of the pulse polarity. Note that FIG. 18 shows only one system of an input of the primary side coil 21 and an output of the secondary side coil 22.

Figure 19:
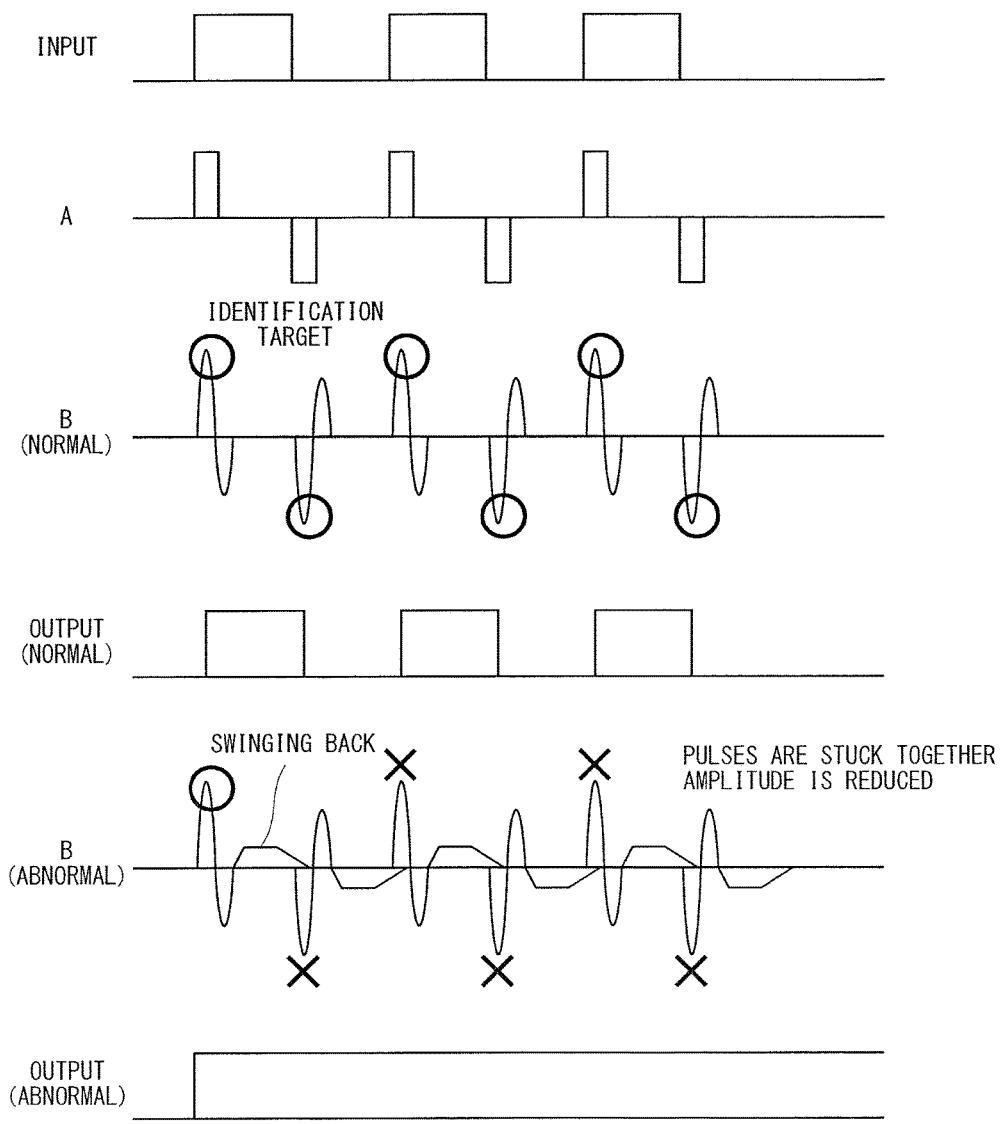
FIG. 19 is a timing chart in a case where the signal is restored in accordance with the pulse polarity.

As described above, on the basis of a signal from the comparator 31, the determination circuit 36 determines which pulse gets thereto first. Signal waveforms in the structure shown in FIG. 18 are shown in FIG. 19. FIG. 19 shows signal waveforms in the case where the signal is restored normally and signal waveforms in the case where an abnormality occurs for the restoration due to the swinging back. By an edge detection of an input signal, the signal A is supplied to the primary side coil 21. By the signal A, when a current flows through the primary side coil 21, the signal B is generated in the secondary side coil 22.

In (1) the signal restoration based on the pulse polarity, it is necessary to separate the counter pulse from the edge pulse to be identified. The signal B is largely affected by the swinging back of the counter pulse. For this reason, in the (1) restoration based on the pulse polarity, more effects of the initialization are obtained as compared to the (2) restoration based on the pulse count and the (3) signal restoration by the Set/Reset.

For example, the swinging back is caused between the edge pulses to be identified. Due to the swinging back, the pulses are stuck together, and an amplitude is reduced. This causes an output abnormality. However, as described in the first to third embodiments, by performing the initialization, it is possible to delete or attenuate the swinging back. Thus, it is possible to restore the signal normally.

(2) Signal Restoration Based on Pulse Count

Figure 20:
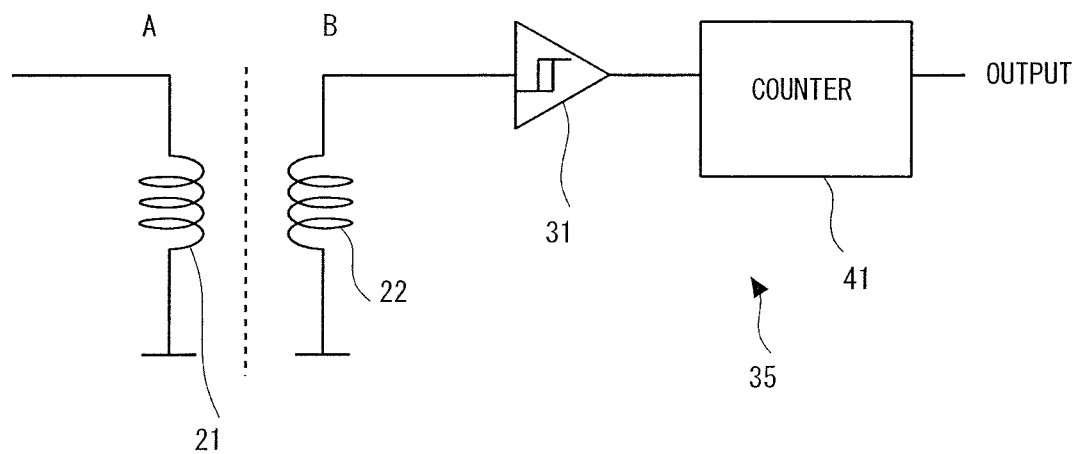
FIG. 20 is a diagram simply showing the structure of restoring a signal in accordance with a pulse count.

An example of the structure of the (2) signal restoration based on the pulse count is shown in FIG. 20. FIG. 20 is a diagram simply showing a circuit structure in which the signal is restored on the basis of the pulse count. Note that FIG. 20 shows only one system of an input of the primary side coil 21 and an output of the secondary side coil 22. In FIG. 20, an output of the comparator 31 is input to a counter 41. The counter 41 restores the signal by counting the edge pulses.

Figure 21:
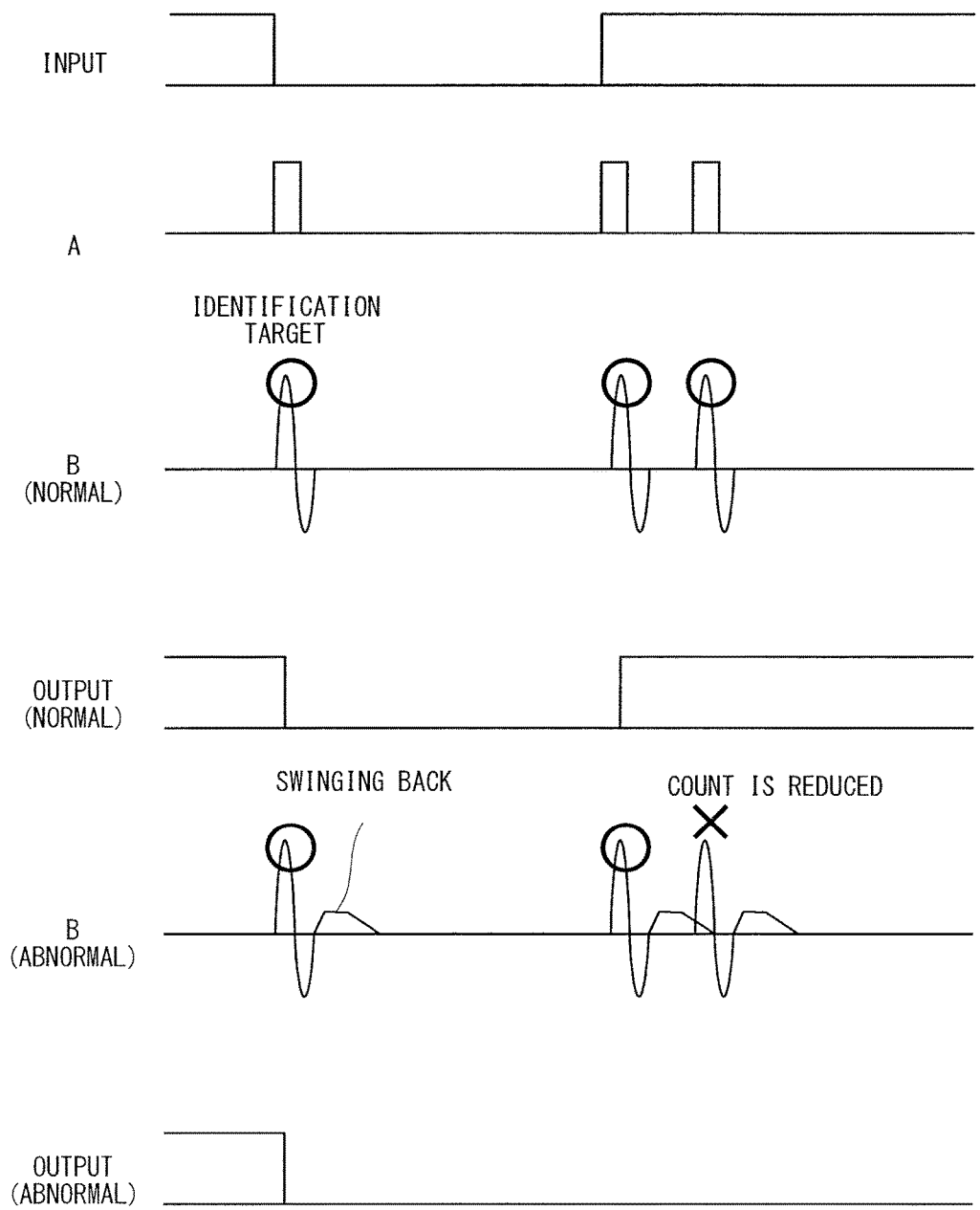
FIG. 21 is a timing chart in a case where the signal is restored in accordance with the pulse count.

In the case where the (2) signal restoration based on the pulse count is performed, the counter pulse does not affect the restoration. However, when the swinging back of the counter pulse occurs, the swinging back may interfere with a subsequent edge pulse. Thus, as shown in FIG. 21, when the swinging back interferes with the subsequent edge pulse, the edge pulse count is decreased. In the case where the signal is restored on the basis of the pulse count, the signal is initialized as described in the first to third embodiments, with the result that the swinging back can be deleted or attenuated. As a result, it is possible to correctly restore the signal.

(3) Signal Restoration by Set/Reset

Figure 22:
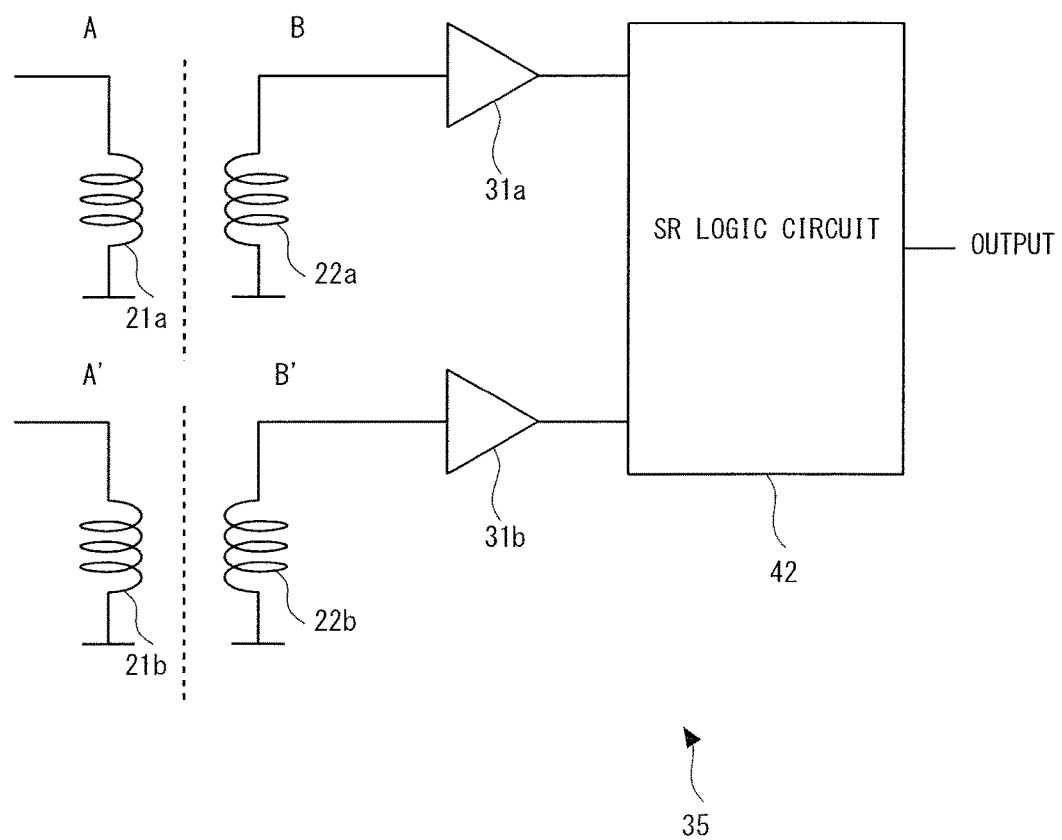
FIG. 22 is a diagram simply showing the structure of restoring a signal by using an SR logic circuit.

The structure of the (3) signal restoration by a Set/Reset will be shown in FIG. 22. FIG. 22 is a diagram simply showing a circuit structure in which the signal is restored by the Set/Reset. Note that in the structure shown in FIG. 22, in the non-contact transmission channel 20, two primary side coils 21a and 21b and two secondary side coils 22a and 22b are provided. Further, The restoration circuit 35 includes comparators 31a and 31b. A signal B from the secondary side coil 22a is input to the comparator 31a. A signal B' from the secondary side coil 22b is input to the comparator 31b. Outputs of the comparators 31a and 31b are input to an SR logic circuit 42. The SR logic circuit 42 includes an SR latch circuit and restores the input signal on the basis of the outputs of the comparator 31a and 31b.

Figure 23:
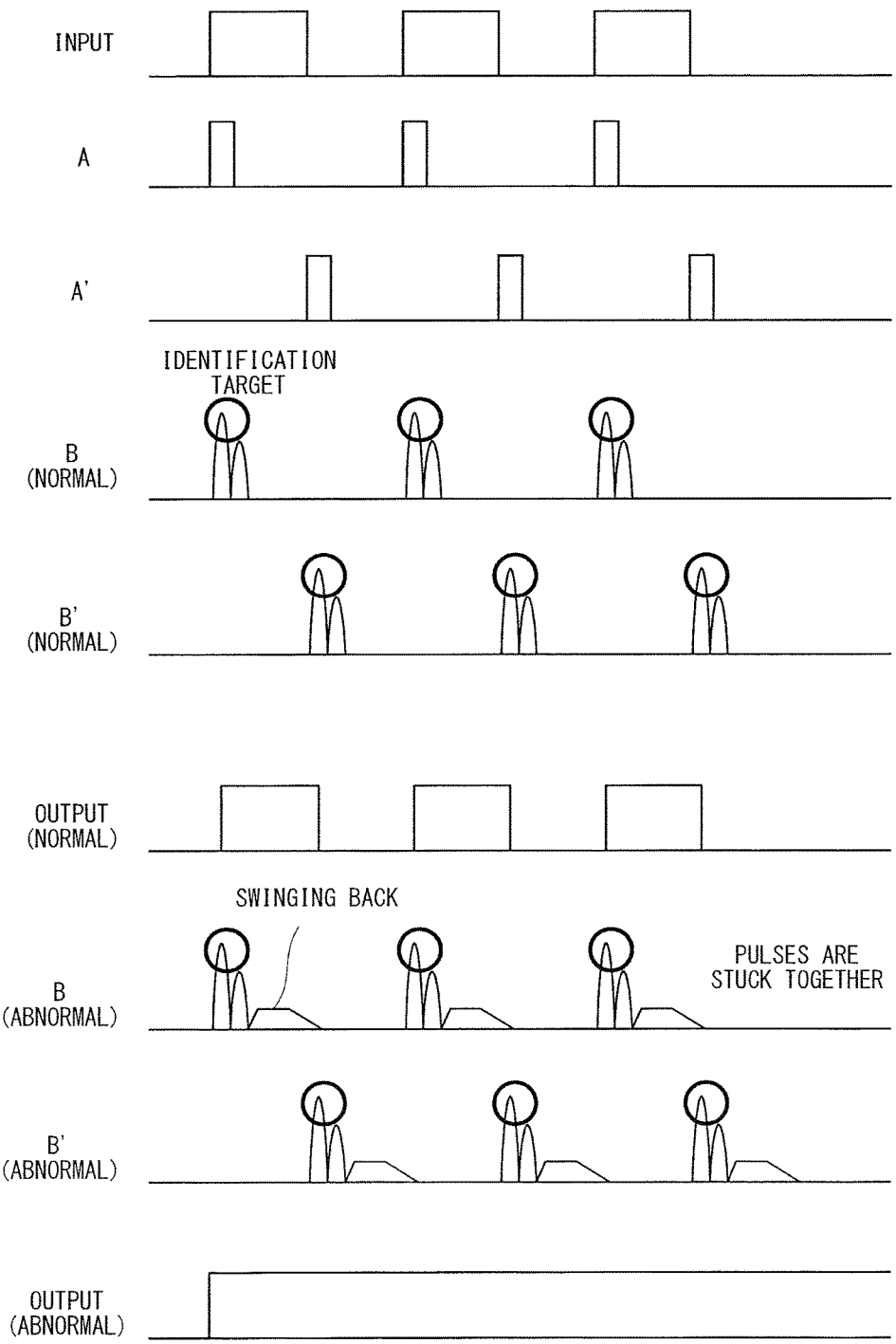
FIG. 23 is a timing chart in a case where the signal is restored by using the SR logic circuit.

In the case where the (3) signal restoration by the Set/Reset is performed, the counter pulse does not affect the restoration. However, when the swinging back of the counter pulse occurs, the pulse may interfere with a subsequent edge pulse. For example, when the swinging back of the counter pulse occurs, the edge pulse of the output B and the pulse of an output B' (swinging back) are temporally stuck together. Therefore, as shown in FIG. 23, when the swinging back causes the interference with the subsequent edge pulse, the signal is erroneously restored. In the case of the structure shown in FIG. 22, by initializing the signal as described in the first to third embodiments, it is possible to delete or attenuate the swinging back. As a result, it is possible to correctly restore the signal.

Application Example

Figure 24:
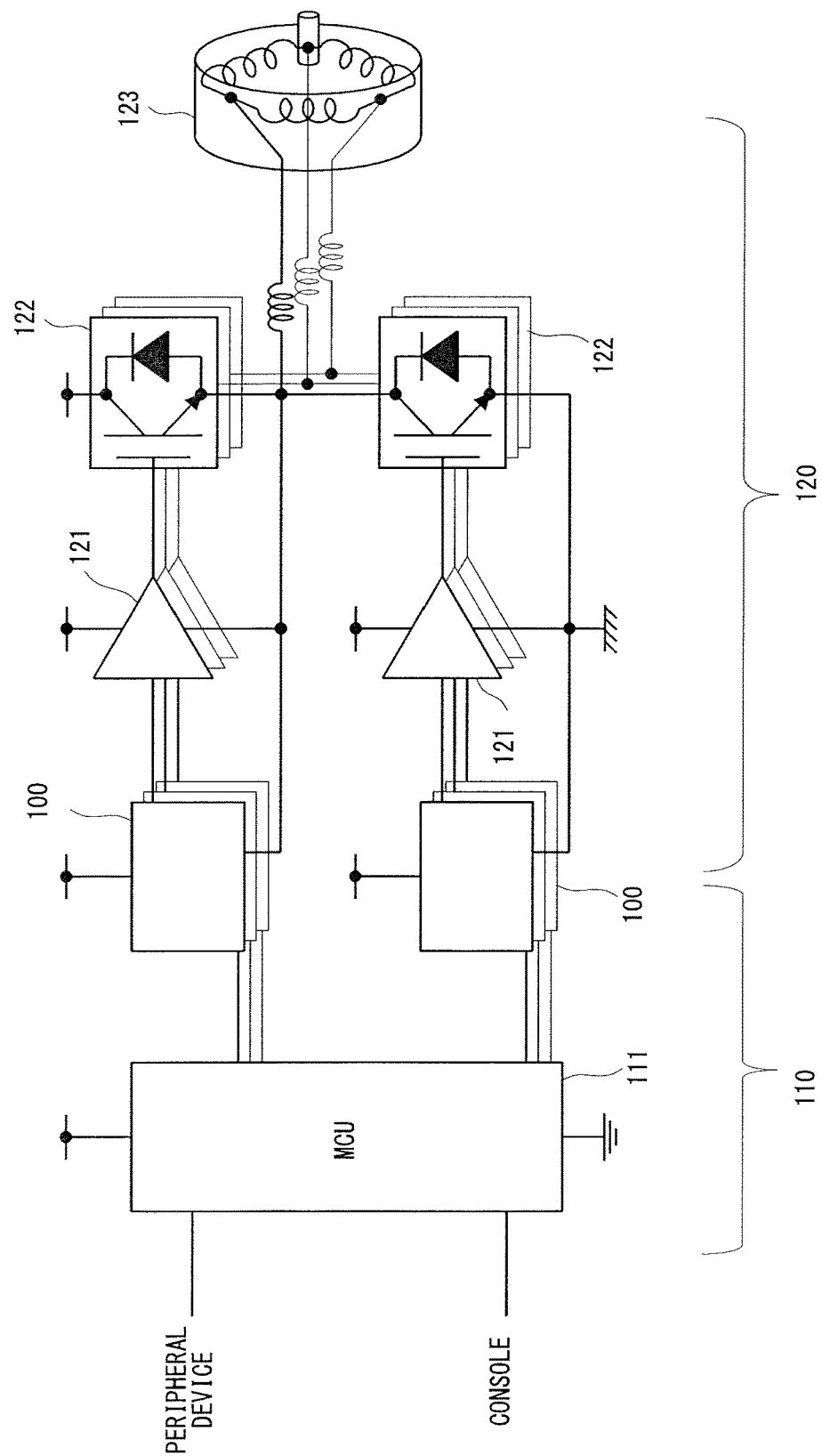
FIG. 24 is a diagram showing an example of application of the communication device according to the embodiments.

The communication device 100 according to this embodiment can be applied to an inverter device that drives a motor by being used as an isolator. FIG. 24 is a diagram showing the structure in the case where the communication device 100 according to this embodiment is applied to an inverter device by being used as an isolator.

The inverter device shown in FIG. 24 has a low-voltage circuit 110 and a high-voltage circuit 120. The low-voltage circuit 110 is operated with a low voltage of approximately 5 V, for example. The high-voltage circuit 120 is operated with a high voltage of approximately 1 kV, for example. That is, the inverter device is separated into the low-voltage circuit 110 and the high-voltage circuit 120. The low-voltage circuit 110 and the high-voltage circuit 120 are isolated by the communication device 100 as the isolator. That is, the primary side coil 21 side of the communication device 100 corresponds to the low-voltage circuit 110, and the secondary side coil 22 side corresponds to the high-voltage circuit 120 with a boundary set between the primary side coil 21 and the secondary side coil 22.

The low-voltage circuit 110 includes a micro controller (MCU) 111. The high-voltage circuit 120 includes a gate driver 121, an IGBT 122, and a motor 123. The micro controller 111 generates transmission data on the basis of an instruction from a peripheral device or a console. The micro controller 111 outputs, for example, transmission data that has been subjected to PWM modulation to the communication device 100. Note that the motor 123 is a three-phase motor driven with a U phase, a V phase, and a W phase, so the communication device 100 is provided for each of UH, UL, VH, VL, WH, and WL. Note that the gate driver 121 and the IGBT 122 are also provided for each of UH, UL, VH, VL, WH, and WL. That is, the communication device 100, the gate driver 121, and the IGBT 122 are provided for six systems.

The communication device 100 outputs a signal to the gate driver 121. On the basis of the signal from the communication device 100, the gate driver 121 drives the IGBT 122. The IGBT 122 supplies a current that flows through the motor 123. As a result, it is possible to control the motor 123 in an analog manner on the basis of the transmission data generated by the micro controller 111.

As described above, on the basis of the signal from the restoration circuit 35, the communication device 100 performs the signal initialization. Thus, it is possible to reliably restore the signal and more correctly drive the motor 123. Note that in the above description, the communication device 100 is used as the isolator, but the communication device 100 is not limited to the isolator, as long as the communication device 100 includes the non-contact transmission channel.

A (The) program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line. (The first and second embodiments can be combined as desirable by one of ordinary skill in the art.)

Further, the structures of the first to third embodiments described above can be combined and used as appropriate. A part or all of the above embodiments can be described as the following notes but are not limited to those.

(Note 1)
A communication device including:
a transmission circuit that converts an input signal into a pulse;
a non-contact transmission channel that includes an AC coupling element and transmits the pulse from the transmission circuit in a non-contact manner;
a restoration circuit that restores the input signal on a basis of a reception signal corresponding to the pulse transmitted via the non-contact transmission channel;
an initialization unit that initializes an output of the non-contact transmission channel; and
an initialization control unit that outputs a control signal of controlling the initialization unit on a basis of the reception signal corresponding to the pulse received via the non-contact transmission channel.

(Note 2)
The communication device according to Note 1, further including a widening circuit that increases a pulse width of the pulse received via the non-contact transmission channel,
in which the restoration circuit restores the input signal on a basis of the received pulse, the pulse width of which is increased by the widening circuit.

(Note 3)
The communication device according to Note 1, further including a circuit that adjusts at least one of a timing and a period of the initialization performed by the initialization unit.

(Note 4)
The communication device according to Note 1, in which the initialization unit is connected to both ends of the AC coupling element on a reception side of the non-contact transmission channel.

(Note 5)
The communication device according to Note 1, in which
the initialization unit includes a transistor connected to a reception side of the non-contact transmission channel,
the initialization control unit performs on/off control for the transistor, and
the transistor is turned on, thereby performing initialization.

(Note 6)
The communication device according to Note 1, in which
the reception signal includes a main pulse and a counter pulse corresponding to the pulses transmitted through the non-contact transmission channel,
the counter pulse has a polarity opposite to the main pulse and is continuous with the main pulse, and
the restoration circuit restores the input signal in accordance with the polarity of the main pulse.

(Note 7)
The communication device according to Note 1, in which, to the non-contact transmission channel, a high-pass filter connected to the AC coupling element is provided.

(Note 8)
A communication method including:
converting an input signal into a pulse in a transmission circuit;
transmitting the pulse from the transmission circuit to a reception circuit in a non-contact manner via a non-contact transmission channel including an AC coupling element;
restoring the input signal on a basis of a reception signal corresponding to the pulse transmitted via the non-contact transmission channel;
generating a control signal on a basis of the reception signal corresponding to the pulse received via the non-contact transmission channel; and
initializing an output of the non-contact transmission channel on a basis of the control signal.

(Note 9)
The communication method according to Note 8, further including:
increasing a pulse width of the pulse received via the non-contact transmission channel; and
restoring the input signal on a basis of the received pulse, the pulse width of which is increased.

(Note 10)
The communication method according to Note 8, further including adjusting at least one of a timing and a period of performing the initialization.

(Note 11)
The communication method according to Note 8, in which, to both ends of the AC coupling element on a reception side of the non-contact transmission channel, an initialization unit that performs the initialization is connected.

(Note 12)

The communication method according to Note 8, in which a transistor is connected to a reception side of the non-contact transmission channel, the transistor is on/off controlled in accordance with the control signal, and the initialization is performed by turning on the transistor.

(Note 13)

The communication method according to Note 8, in which the reception signal includes a main pulse and a counter pulse corresponding to the pulses transmitted through the non-contact transmission channel, the counter pulse has a polarity opposite to the main pulse and is continuous with the main pulse, and the input signal is restored in accordance with the polarity of the main pulse.

(Note 14)

The communication method according to Note 8, in which, to the non-contact transmission channel, a high-pass filter connected to the AC coupling element is provided.

(Note 15)

A receiver including:

a restoration circuit that restores an input signal on a basis of a reception signal corresponding to a pulse transmitted via a non-contact transmission channel including an AC coupling element;

an initialization unit that initializes an output of the non-contact transmission channel; and an initialization control unit that outputs a control signal of controlling the initialization unit on a basis of the reception signal corresponding to the pulse received via the non-contact transmission channel.

(Note 16)

The receiver according to Note 15, further including a widening circuit that increases a pulse width of the pulse received via the non-contact transmission channel, in which the restoration circuit restores the input signal on a basis of the received pulse, the pulse width of which is increased by the widening circuit.

(Note 17)

The receiver according to Note 15, further including a circuit that adjusts at least one of a timing and a period of the initialization performed by the initialization unit.

(Note 18)

The receiver according to Note 15, in which the initialization unit is connected to both ends of the AC coupling element on a reception side of the non-contact transmission channel.

(Note 19)

The receiver according to Note 15, in which the initialization unit includes a transistor connected to a reception side of the non-contact transmission channel, the initialization control unit performs on/off control for the transistor, and the transistor is turned on, thereby performing the initialization.

(Note 20)

The receiver according to Note 15, in which the reception signal includes a main pulse and a counter pulse corresponding to the pulses transmitted through the non-contact transmission channel, the counter pulse has a polarity opposite to the main pulse and is continuous with the main pulse, and the restoration circuit restores the input signal in accordance with the polarity of the main pulse.

In the above, the invention carried out by the inventor of the present invention is specifically described on the basis of the embodiments. However, the present invention is not limited to the embodiments described above and can of course be variously changed without departing from the gist of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A communication device comprising:
    a transmission circuit that converts an input signal into a pulse;
    a non-contact transmission channel that includes an AC coupling element and transmits the pulse from the transmission circuit in a non-contact manner;
    an initialization control circuit that generates a control signal on a basis of a reception signal corresponding to the pulse received via the non-contact transmission channel; and
    an initialization circuit that initializes an output of the non-contact transmission channel based on the generated control signal; and
    a restoration circuit that restores the input signal based on the reception signal corresponding to the pulse transmitted via the non-contact transmission channel and based on the initialization of the output of the non-contact transmission channel by the initialization circuit,
    wherein the restoration circuit comprises:
        a first comparator and a second comparator, the first and the second comparators configured to detect a polarity of the reception signal;
        a first terminal coupled to a first end of the AC coupling element; and
        a second terminal coupled to a second end of the AC coupling element,
        wherein the first terminal is further coupled to a non-inverting terminal of the first comparator and an inverting terminal of the second comparator
        wherein the second terminal is further coupled to a non-inverting terminal of the second comparator and an inverting terminal of the first comparator, and
        wherein the initialization circuit is disposed between the first terminal and the second terminal.

2. The communication device according to claim 1, further comprising a widening circuit that increases a pulse width of the pulse received via the non-contact transmission channel,
    wherein the restoration circuit restores the input signal on a basis of the received pulse, the pulse width of which is increased by the widening circuit.

3. The communication device according to claim 1, further comprising a circuit that adjusts at least one of a timing and a period of the initialization performed by the initialization circuit.

4. The communication device according to claim 1, wherein the initialization circuit is connected to both ends of the AC coupling element on a reception side of the non-contact transmission channel.

5. The communication device according to claim 1, wherein
the initialization circuit includes a transistor connected to a reception side of the non-contact transmission channel,
wherein the initialization control circuit performs on/off control for the transistor,
wherein the transistor is turned on, thereby performing initialization, and
wherein a source of the transistor is directly connected to the first terminal, a drain of the transistor is directly connected to the second terminal and a gate of the transistor is configured to receive the control signal generated by the initialization control circuit.

6. The communication device according to claim 1, wherein
the reception signal includes a main pulse and a counter pulse corresponding to the pulses transmitted through the non-contact transmission channel,
the counter pulse has a polarity opposite to the main pulse and is continuous with the main pulse, and
the restoration circuit restores the input signal in accordance with the polarity of the main pulse.

7. The communication device according to claim 1, wherein, to the non-contact transmission channel, a high-pass filter connected to the AC coupling element is provided.

8. A communication method comprising:
converting an input signal into a pulse in a transmission circuit;
transmitting the pulse from the transmission circuit to a reception circuit in a non-contact manner via a non-contact transmission channel including an AC coupling element;
generating a control signal a basis of a reception signal corresponding to the pulse received via the non-contact transmission channel;
initializing, by an initialization circuit, an output of the non-contact transmission channel based on the generated control signal; and
restoring, by a restoration circuit, the input signal based on the reception signal corresponding to the pulse transmitted via the non-contact transmission channel and based on the initialization of the output of the non-contact transmission channel,
wherein the restoring the input signal comprises detecting a polarity of the reception signal by a first comparator and a second comparator,
wherein a first terminal of the restoration circuit is coupled to a first end of the AC coupling element,
wherein a second terminal of the restoration circuit is coupled to a second end of the AC coupling element,
wherein the first terminal is further coupled to a non-inverting terminal of the first comparator and an inverting terminal of the second comparator,
wherein the second terminal is further coupled to a non-inverting terminal of the second comparator and an inverting terminal of the first comparator, and
wherein the initialization circuit is disposed between the first terminal and the second terminal.

9. The communication method according to claim 8, further comprising:
increasing a pulse width of the pulse received via the non-contact transmission channel; and
restoring the input signal on a basis of the received pulse, the pulse width of which is increased.

10. The communication method according to claim 8, further comprising adjusting at least one of a timing and a period of performing the initialization.

11. The communication method according to claim 8, wherein, to both ends of the AC coupling element on a reception side of the non-contact transmission channel, an initialization circuit that performs the initialization is connected.

12. The communication method according to claim 8, wherein, the initialization circuit comprises a transistor that is connected to a reception side of the non-contact transmission channel,
wherein the transistor is on/off controlled in accordance with the control signal,
wherein the initialization is performed by turning on the transistor, and
wherein a source of the transistor is directly connected to the first terminal, a drain of the transistor is directly connected to the second terminal and a gate of the transistor is configured to receive the control signal generated by the initialization control circuit.

13. The communication method according to claim 8, wherein
the reception signal includes a main pulse and a counter pulse corresponding to the pulses transmitted through the non-contact transmission channel,
the counter pulse has a polarity opposite to the main pulse and is continuous with the main pulse, and
the input signal is restored in accordance with the polarity of the main pulse.

14. The communication method according to claim 8, wherein, to the non-contact transmission channel, a high-pass filter connected to the AC coupling element is provided.

15. A receiver comprising:
a processor configured to execute:
an initialization control circuit that generates a control signal on a basis of a reception signal corresponding to a pulse received via a non-contact transmission channel; and
an initialization circuit that initializes an output of the non-contact transmission channel based on the generated control signal; and
a restoration circuit that restores an input signal based on the reception signal corresponding to the pulse transmitted via the non-contact transmission channel including an AC coupling element and based on the initialization of the output of the non-contact transmission channel by the initialization circuit,
wherein the restoration circuit comprises a first comparator and a second comparator, the first and the second comparators configured to detect a polarity of the reception signal,
a first terminal coupled to a first end of the AC coupling element; and
a second terminal coupled to a second end of the AC coupling element,
wherein the first terminal is further coupled to a non-inverting terminal of the first comparator and an inverting terminal of the second comparator,
wherein the second terminal is further coupled to a non-inverting of the second comparator and an inverting terminal of the first comparator, and
wherein the initialization circuit is disposed between the first terminal and the second terminal.

16. The receiver according to claim 15, further comprising a widening circuit that increases a pulse width of the pulse received via the non-contact transmission channel,
   wherein the restoration circuit restores the input signal on a basis of the received pulse, the pulse width of which is increased by the widening circuit.

17. The receiver according to claim 15, further comprising a circuit that adjusts at least one of a timing and a period of the initialization performed by the initialization circuit.

18. The receiver according to claim 15, wherein the initialization circuit is connected to both ends of the AC coupling element on a reception side of the non-contact transmission channel.

19. The receiver according to claim 15, wherein
   wherein the initialization circuit includes a transistor connected to a reception side of the non-contact transmission channel,
   wherein the initialization control circuit performs on/off control for the transistor,
   wherein the transistor is turned on, thereby performing the initialization, and
   wherein a source of the transistor is directly connected to the first terminal, a drain of the transistor is directly connected to the second terminal and a gate of the transistor is configured to receive the control signal generated by the initialization control circuit.

20. The receiver according to claim 15, wherein
   the reception signal includes a main pulse and a counter pulse corresponding to the pulses transmitted through the non-contact transmission channel,
   the counter pulse has a polarity opposite to the main pulse and is continuous with the main pulse, and
   the restoration circuit restores the input signal in accordance with the polarity of the main pulse.

* * * * *